United States Patent
Kobayashi et al.

[11] Patent Number: 5,998,863
[45] Date of Patent: Dec. 7, 1999

[54] COOLING APPARATUS BOILING AND CONDENSING REFRIGERANT

[75] Inventors: Kazuo Kobayashi, Kariya; Kiyoshi Kawaguchi, Toyota, both of Japan

[73] Assignee: Denso Corporation, Kariya, Japan

[21] Appl. No.: 08/893,927

[22] Filed: Jul. 15, 1997

[30] Foreign Application Priority Data

Jul. 19, 1996 [JP] Japan ................................. 8-190455
Sep. 30, 1996 [JP] Japan ................................. 8-257991
May 20, 1997 [JP] Japan ................................. 9-129552

[51] Int. Cl.$^6$ ................................................. H01L 23/34
[52] U.S. Cl. ...................... 257/715; 165/104.33; 361/699
[58] Field of Search .................................. 257/714, 715, 257/716; 165/104.33; 361/699

[56] References Cited

U.S. PATENT DOCUMENTS

| | | | |
|---|---|---|---|
| 4,145,708 | 3/1979 | Ferro et al. | 257/715 |
| 4,897,762 | 1/1990 | Daikoku et al. | 361/699 |
| 5,198,889 | 3/1993 | Hisano et al. | 257/678 |
| 5,216,580 | 6/1993 | Davidson et al. | 361/385 |
| 5,613,552 | 3/1997 | Osakabe et al. | 165/104.21 |
| 5,647,430 | 7/1997 | Tajima | 165/104.33 |

FOREIGN PATENT DOCUMENTS 57-204156 12/1982 Japan .
8-264692 10/1996 Japan .

OTHER PUBLICATIONS

U.S. application No. 08/504,025 Osakabe et al., filed Jul. 1995.
U.S. application No. 08/524,437 Osakabe et al., filed Sep. 1995.
U.S. application No. 08/497,950 Osakabe et al., filed Jul. 1995.
U.S. application No. 08/503,862 Osakabe et al., filed Jul. 1995.
U.S. application No. 08/579,301 Osakabe et al., filed Dec. 1995.
U.S. application No. 08/724,594 Kadota et al., filed Sep. 1996.
U.S. application No. 08/674,821 Osakabe et al., filed Jul. 1996.
U.S. application No. 08/790,015 Kadota et al., filed Jan. 1997.
U.S. application No. 08/818,731 Osakabe et al., filed Mar. 1997.
U.S. application No. 08/811,879 Osakabe et al., filed Mar. 1978.

*Primary Examiner*—Teresa M. Arroyo
*Attorney, Agent, or Firm*—Harness, Dickey & Pierce, PLC

[57] ABSTRACT

According to the present invention, the cooling apparatus includes a refrigerant tank to which a semiconductor device is attached, a connection chamber which is open to the central portion of the refrigerant tank on the side opposite to the side where the semiconductor device is mounted, a first tube (a first radiator) having one end in communication with the connection chamber and the other end in communication with one end of the refrigerant tank, a second tube (a second radiator) having one end in communication with the connection chamber and the other end in communication with the other end of the refrigerant tank, and refrigerant contained in the refrigerant tank. Even when the cooling apparatus is inclined, at least one of the other end of the first tube and the other end of the second tube can be immersed below the liquid level of the refrigerant so that the refrigerant can circulate within the refrigerant tank efficiently.

19 Claims, 17 Drawing Sheets

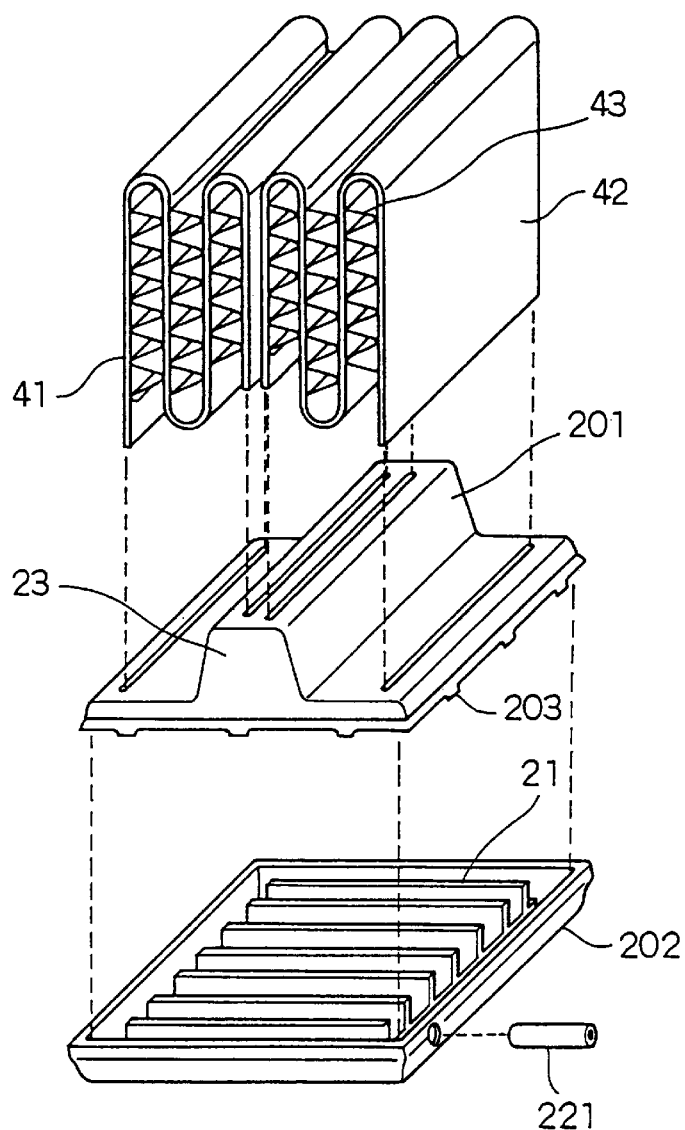
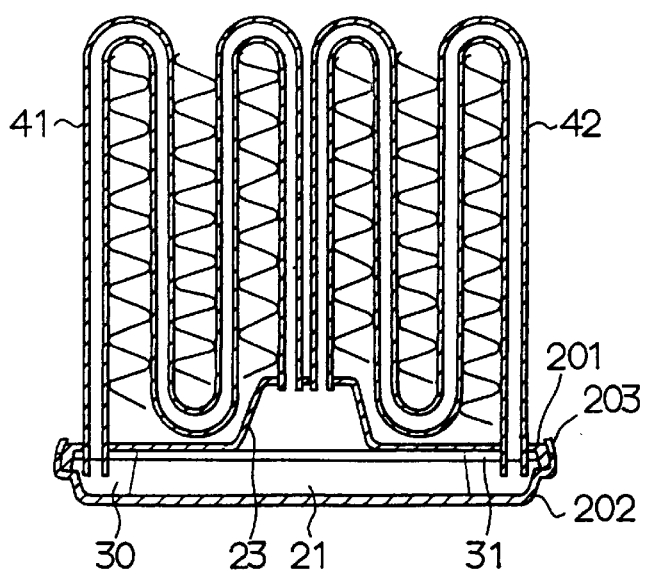
FIG. 6
FIG. 7

COOLING APPARATUS BOILING AND CONDENSING REFRIGERANT

CROSS REFERENCE TO THE RELATED APPLICATIONS

This application is based on and claims priority of Japanese Patent Application Nos. Hei. 8-190455 filed on Jul. 19, 1996, Hei. No. 8-257991 filed on Sep. 30, 1996, and No. 9-129552 filed on May 20, 1997, the contents of which are incorporated herein by reference.

BACKGROUND OF THE INVENTION

1. Field of the Invention

The present invention relates to a cooling apparatus for cooling high-temperature mediums, and is used for cooling heat generating elements such as semiconductor devices and electric devices.

2. Description of Related Art

Conventionally, cooling apparatuses boiling and condensing refrigerant, for cooling heat generated from heat generating elements have been known. Further, as disclosed in JP-A-57-204156, there has been known a cooling apparatus provided with a first communication pipe for introducing a refrigerant after being boiled and vaporized by the heat of the heat generating element to a radiator and a second communication pipe for introducing the refrigerant after being condensed by the radiator back to a refrigerant tank, so that the refrigerant circulates within the apparatus to improve the heat radiating performance.

In the cooling apparatus disclosed in the JP-A-57-204156, a single first communication pipe is disposed above the liquid level of the refrigerant in the vicinity of a peripheral edge portion of the refrigerant tank. Further, a single second communication pipe is disposed so as to be open below the liquid level of the refrigerant in the vicinity of a peripheral edge portion of the refrigerant tank, and is immersed in the refrigerant.

With a recent tendency to the reduction in size of the apparatus itself, it has been demanded to install heat generating elements and the cooling apparatus itself with various inclination angles.

In the above-described cooling apparatus, however, since the single first communication pipe is disposed above the liquid level of the refrigerant in the peripheral edge portion of the refrigerant tank and the single second communication pipe is disposed as to be open below the refrigerant liquid level in the peripheral edge portion of the refrigerant tank, there occurs the following problems when the cooling apparatus itself is inclined.

(1) When both of the connecting portion between the refrigerant tank and the first communication pipe and the connecting portion between the refrigerant tank and the second communication pipe are exposed from the refrigerant liquid level, the refrigerant after being boiled and vaporized does not circulate efficiently so that the heat radiating performance is deteriorated remarkably.

(2) When both of the connecting portion between the refrigerant tank and the first communication pipe and the connecting portion between the refrigerant tank and the second communication pipe are immersed in the refrigerant, the refrigerant tank is filled with the refrigerant after being boiled and vaporized, so that the heat radiating performance is deteriorated remarkably.

SUMMARY OF THE INVENTION

The present invention has been accomplished in view of the above-mentioned problems, and it is an object of the invention to provide a cooling apparatus capable of suppressing the heat radiating performance from being deteriorated even when the apparatus is inclined.

It is another object of the present invention to provide a cooling apparatus in which the refrigerant can circulate efficiently even when the apparatus is inclined.

It is further another object of the present invention to provide a cooling apparatus in which the refrigerant can circulate efficiently even if the refrigerant tank is disposed in a horizontal direction or a vertical direction.

It is still another object of the present invention to provide a cooling apparatus which can be installed while being inclined with new construction.

According to a first aspect of the present invention, in a cooling apparatus boiling and condensing refrigerant, for cooling high-temperature medium, one end of a first radiator is in communication substantially with a central portion of a refrigerant tank and an opposite end is in communication substantially with one peripheral edge portion of the refrigerant tank. Further, one end of a second radiator is in communication substantially with the central portion of the refrigerant tank and an opposite end is in communication substantially with another peripheral edge portion other than the one peripheral edge portion. In this way, even when the cooling apparatus is inclined, at least one of the opposite end of the first radiator and the opposite end of the second radiator can be immersed in the refrigerant, that is, positioned below the liquid level of the refrigerant. For example, when the opposite end of the second radiator is immersed in the refrigerant and the interior of the refrigerant tank is filled with the refrigerant up to the central portion thereof, one end of the first radiator is positioned below the liquid level of the refrigerant, so that the refrigerant can circulate within the first radiator. Even when the opposite end of the second radiator is immersed in the refrigerant, if the interior of the refrigerant tank is not filled with the refrigerant up to the central portion thereof, one end of the second radiator is positioned below the liquid level of the refrigerant, so that the refrigerant can circulate within the second radiator.

Thus, even when the apparatus is inclined, it is possible for the refrigerant to circulate efficiently and to suppress the heat radiating performance from being remarkably. Besides, the refrigerant can circulate efficiently when the refrigerant tank is disposed horizontally or vertically.

Further, each one end of the first radiator and the second radiator may be in communication with the refrigerant tank at positions above the liquid level of the refrigerant, while each of the opposite ends of the first radiator and the second radiator may be in communication with the refrigerant tank at positions below the refrigerant liquid level. Consequently, when the cooling apparatus is inclined with a small inclination angle, the heat generated can be radiated efficiently by means of the first and second radiators.

Still further, each one end of the first radiator and the second radiator may be in communication with the refrigerant tank though a connection chamber. Accordingly, even when the cooling apparatus is inclined with a large inclination angle, it is possible to prevent both of one end of the first radiator and one end of the second radiator from being located below the liquid level of the refrigerant.

Further, one end of the first radiator and one end of the second radiator may be in communication with the refrigerant tank at a position below the liquid level of the refrigerant, while one of the opposite ends of the first and second radiators may be in communication with the refrigerant tank at a position above the refrigerant liquid level.

Therefore, even when the cooling apparatus is inclined, the refrigerant can circulates through one of the first and second radiators.

Still further, a semiconductor device as high-temperature medium is fixed to the central portion of the refrigerant tank. Therefore, the heat generated from the semiconductor device can be absorbed efficiently even when the apparatus is inclined.

An interior of the refrigerant tank may be provided with an inner fin extending from one peripheral edge side to another. Therefore, the flow of refrigerant in the refrigerant tank can be smoothed, with the result that the refrigerant can circulates smoothly within the refrigerant tank.

The inner fin may be formed of a plurality of plate members disposed to incline from one peripheral edge side to another. Therefore, even when the refrigerant tank is inclined, the refrigerant which has become high in temperature can be moved efficiently to the liquid level side of the refrigerant.

Each of the first and second radiators may be formed of a cylindrical member which is bent in a meandering shape. Thus, both radiators can be formed easily.

Each of the cylindrical members, which constitutes the first and second radiators, may be a flat tube having plural holes, formed by extruding from one end side to the opposite end side. Therefore, even when the apparatus maybe inclined in any direction, the refrigerant can circulate through any one of holes.

Further, the refrigerant tank may be formed of a flat tube having plural holes, which is formed by extruding from one peripheral edge side to the opposite peripheral edge side. Therefore, the refrigerant flow in the refrigerant tank can be smoothed by the holes of the tube.

According to a second aspect of the present invention, a heat transfer member is disposed within a refrigerant tank so that a portion thereof is positioned below the liquid level of a refrigerant even when the refrigerant tank is reversed or inclined at any angle. Thus, the apparatus may be installed in any direction or at any angle, the heat generated from high-temperature medium can be surely transferred to the refrigerant. Accordingly, it is possible to suppress the heat radiating performance from being deteriorated.

Further, a first plate partition member may be provided between the central portion and one peripheral edge portion within the refrigerant tank, and a second plate partition member may be provided between the central portion and another peripheral edge portion in the same tank. When the refrigerant tank is used to stand vertically, a pressure difference is created within the refrigerant tank by the partition walls, so that the circulation of the refrigerant in at least one of the first and second radiators can be promoted.

Further, the first and second plate partition members may have opening portions spaced diagonally from each other in the refrigerant tank. In this way, when the refrigerant tank is disposed to stand vertically, a pressure difference is created within the refrigerant tank by at least one partition wall, so that the circulation of refrigerant in at least one of the first and second radiators can be promoted. Also when the refrigerant tank is disposed horizontally, the refrigerant condensed in a radiator and returned into the marginal space in the refrigerant tank can be moved to the central space in the tank through the opening portions, with the result that the refrigerant can circulate efficiently.

Still further, the first plate partition member may have an opening portion at one end thereof and be connected at the other end to the inner wall of the refrigerant tank, and the second plate partition member may have an opening portion at one end thereof on the side where the first member is connected to the inner wall of the refrigerant tank and be connected to the inner wall of the refrigerant tank at an end portion where the opening of the first member is formed.

In this way, a pressure difference is created within the refrigerant tank by at least one of the partition members, so that the circulation of refrigerant in at least one of the first and second radiators can be promoted. Further, when the refrigerant tank is disposed horizontally, the refrigerant condensed in a radiator and returned into the space at the peripheral edge of the refrigerant tank can be moved to the central space in the tank through the opening portions, and the refrigerant can circulate efficiently. Further, even if the refrigerant tank in a standing state is reversed upside down, the above effect can be obtained.

BRIEF DESCRIPTION OF THE DRAWINGS

Additional objects and advantages of the present invention will be more readily apparent from the following detailed description of preferred embodiments thereof when taken together with the accompanying drawings in which:

FIG. 6 is a perspective view showing components of the cooling apparatus of the fourth embodiment;

FIG. 7 is a perspective view showing a modification of the cooling apparatus of the fourth embodiment;

DETAILED DESCRIPTION OF THE PREFERRED EMBODIMENTS

A first embodiment of the present invention will be described.

Figure 1:
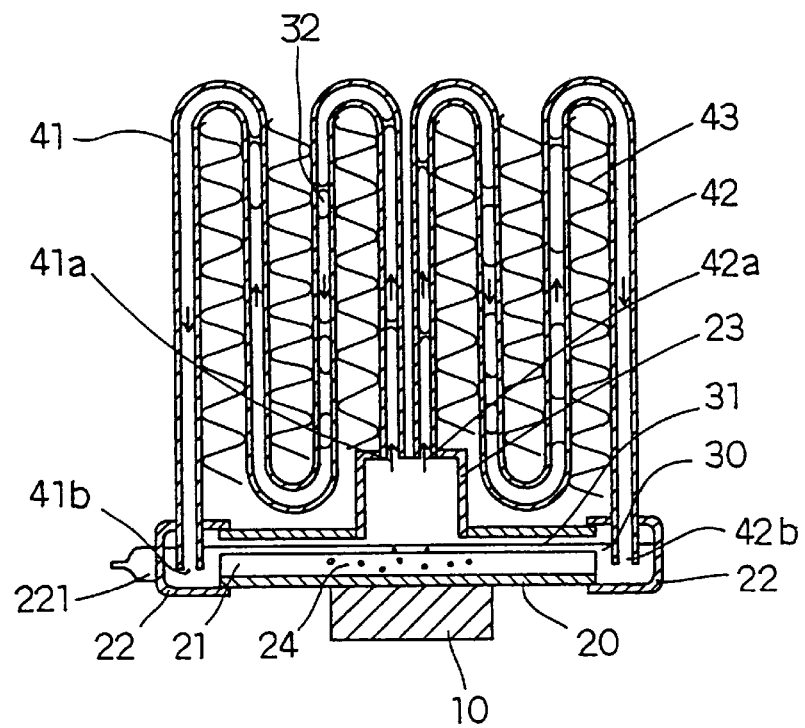
FIG. 1 is a front view of a cooling apparatus according to a first embodiment of the present invention.
Figure 2:
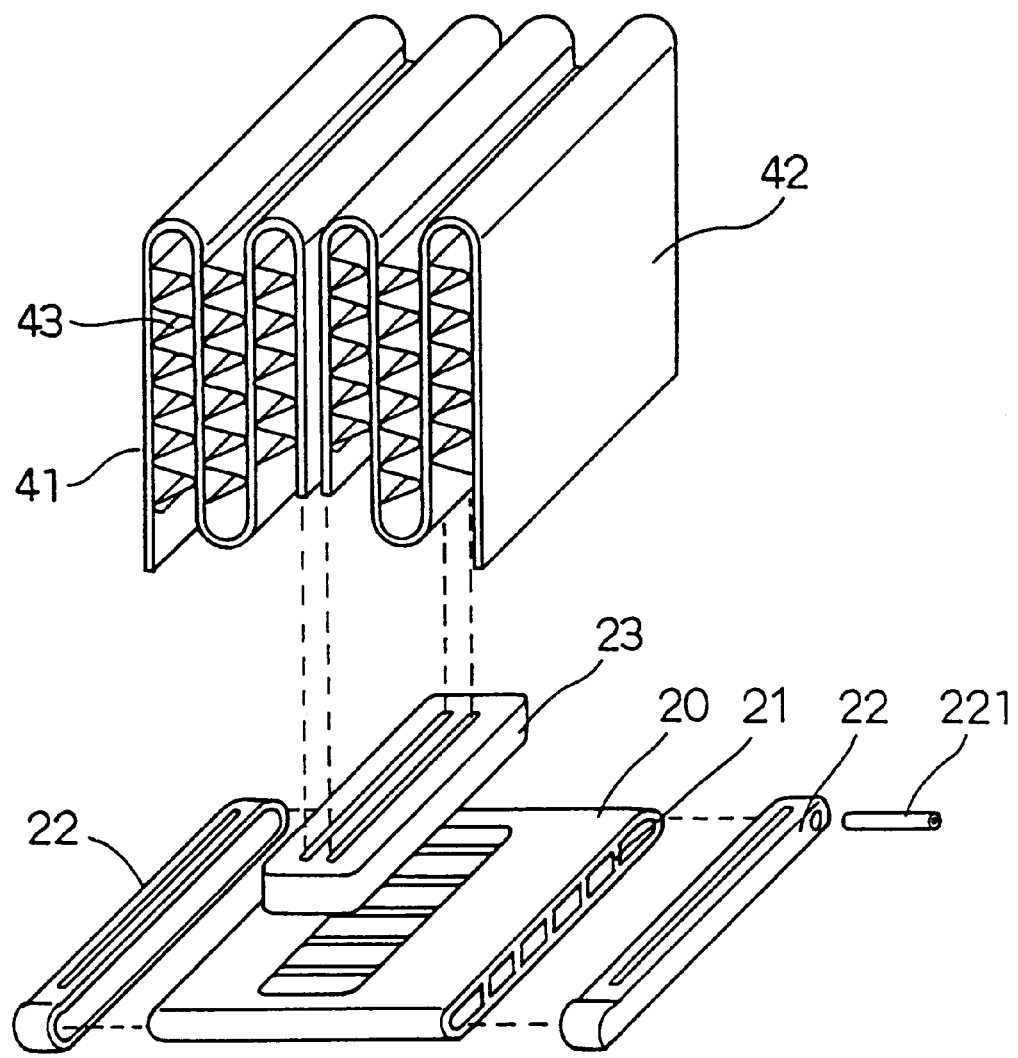
FIG. 2 is a perspective view showing components of the cooling apparatus of the first embodiment.

FIG. 1 is a front view of a cooling apparatus according to the first embodiment of the present invention; and FIG. 2 is a perspective view showing components of the cooling apparatus.

The cooling apparatus of this embodiment will now be described with reference to FIGS. 1 and 2. The cooling apparatus of this embodiment is for cooling, for example, a semiconductor device used in an electronic apparatus, and includes a refrigerant tank 20 to which a semiconductor device 10 (a high-temperature medium, a heat generating element) is attached, a connection chamber 23 formed on a wall surface of a central portion of the refrigerant tank on a side opposite to the side where the semiconductor device is mounted, two caps 22 for sealing the refrigerant tank 20 at both end portions (peripheral edges of the tank, a first tube (first radiator) 41, one end of which is in communication with the connection chamber 23 and the other end of which is in communication with one of the caps 22, a second tube 42 (second radiator), one end of which is in communication with the connection chamber 23 and the other end of which is in communication with the other cap 22, and a refrigerant 30 contained in the refrigerant tank 20.

The semiconductor device 10 generates heat upon when an electric current is supplied thereto, and may be a power semiconductor device in a computer or a semiconductor device which generates a large heat amount, such as a processing unit.

The refrigerant tank 20 is constituted by a flat tubular member formed, for example, by extruding aluminum. In an interior of the refrigerant tank 20 are provided with inner fins 21 (a heat transfer member) for smoothing a flow of the refrigerant 30 in the tank 20 and also for increasing an inner surface area. The inner fins are disposed in parallel with the extruding direction (the right and left direction in FIG. 1).

The inner fins 21 can be formed easily by perforating (a flat tube having plural holes) simultaneously when the tubular member is extruded, that is, the partition wall between the holes is used as an inner fin 21 (see FIG. 2). To the bottom surface (heat absorbing side) around the central portion of the refrigerant tank 20 is fixed the semiconductor device 10 with, for example, a threaded member (screw) or an engaging member (rivet).

The central portion as referred herein indicates an area including the center of the refrigerant tank 20. The semiconductor device may be fixed at a position deviated from the center of the tank 20. The portion to which the inner fins 21 are connected corresponds to an inner surface of the refrigerant tank opposed to the heat absorbing side. As to the inner fins, inner fins formed separately may be fitted in an interior of a tubular member after the tubular member is extruded. Further, the refrigerant tank 20 may be manufactured by pressing a thin plate or by die-casting or cutting.

The connection chamber 23 is a member connected hermetically to an opening formed in the central portion of the refrigerant tank 20 and is disposed on the wall surface opposite to the side where the semiconductor device 10 is attached to the refrigerant tank 20 (see FIG. 2). For example, the connection chamber 23 may be formed by pressing an aluminum brazing sheet.

The caps 22 are fitted on both end portions (the end portions in the extruding direction) of the tubular member of the refrigerant tank 20 to close the tubular member (see FIG. 2). The tubular member and the caps 22 constitute the refrigerant tank. For example, the tank may be formed by pressing an aluminum brazing sheet.

The refrigerant 30 is, for example, of a fluorocarbon type such as $C_6F_{14}$, is sealed into the refrigerant tank 20, and is boiled and vaporized while absorbing heat from the semiconductor device 10. The refrigerant 30 may be water or HFC-134a as substitute Flon.

To at least one of the caps 22 is attached an inlet pipe 221 for filling the refrigerant 30 into the refrigerant tank 20. After the refrigerant 30 is supplied into the tank 20, the inlet pipe 221 is crimped to seal the tank 20. Then, the front end of the sealed portion may be brazed or welded to improve an air-tightness of the sealing portion.

The first tube 41 is constituted by a flat tubular member formed by extruding, for example, aluminum. When the first tube 41 is extruded, there are also formed a plurality of holes (not shown) in an interior of the first tube 41 in such a manner that the holes are disposed in parallel with the extruding direction (a flat tube having plural holes). As shown in FIGS. 1 and 2, the tubular member is formed in a meandering shape. One end of the first tube 41 is in communication with the connection chamber 23 and is open above liquid level of the refrigerant 30. Thus, one end of the first tube 41 is in communication with the refrigerant tank 20 through the connection chamber 23. The other end of the first tube 41 is fitted into one of the caps 22 and is open below an upper end of the inner fins 21 and below a liquid level 31 of the refrigerant 30.

Similar to the first tube 41, the second tube 42 is also constituted by a flat tubular member formed by extruding, for example using, aluminum. When the second tube 42 is extruded, a plurality of holes (not shown) each having a meandering shape are formed in an interior of the tubular member in such a manner that the holes are disposed in parallel with the extruding direction (a flat tube having plural holes). One end of the second tube 42 is in communication with the connection chamber 23 and is open above the liquid level of the refrigerant 30. Thus, one end of the second tube is in communication with the refrigerant tank 20 through the connection chamber 23. The other end of the second tube 42 is fitted into the other cap 22 and is open below the upper end of the inner fins 21 and below the liquid level 31 of the refrigerant 30.

Further, heat radiating fins 43 for improving radiating amount in the first tube 41 are disposed between adjacent tubular member portions of the first tube 41 and also between adjacent tubular members of the second tube 42. The heat radiating fins 43 increase an area of heat radiation of both first and second tubes 41 and 42. For example, the fins 43 may be formed by pressing an aluminum brazing sheet.

An operation of the cooling apparatus of this embodiment will be described below briefly.

In the cooling apparatus shown in FIG. 1, when the semiconductor device 10 generates heat when an electric current is supplied thereto, the heat is transmitted on the wall surface of the refrigerant tank 20 and reaches a boiling section 24. Then, the heat is further transmitted to the refrigerant 30 through the inner fins 21 which are in contact with the boiling section 24. The refrigerant 30 which has absorbed heat from the inner fins 21 is boiled and vaporized by the heat. The resulting vapor of the refrigerant rises toward the connection chamber 23. The gaseous refrigerant which has entered the connection chamber 23 become bubbles 32 and flows into the first and second tubes 41 and 42 through one ends 41a and 42a as openings of the first and second tubes. While moving through the first and second tubes 41 and 42, the gaseous refrigerant radiate heat to the wall surfaces of the tubes and is condensed. The condensed refrigerant is returned to the refrigerant tank 20 through the other ends 41b and 42b as openings of the first and second tubes 41 and 42.

An operation of the cooling apparatus installed with various angles will be described below in detail.

(1) In this embodiment, when the cooling apparatus is installed substantially horizontally (FIG. 1), that is, when both of the other end 41b of the first tube 41 and the other end 42b of the second tube 42 are open below the liquid level of the refrigerant 30, there occur an increase of pressure in the upper portion of the refrigerant tank due to the boiling and vaporization and a decrease of pressure due to the condensation in the refrigerant 30.

The refrigerant which has been boiled and vaporized circulates along a route in the order of connection chamber, one ends of the first and second tubes, first and second tubes, the other ends of the first, and second tubes refrigerant tank. Thus, when the cooling apparatus is disposed substantially horizontally, the refrigerant 30 can circulates through both of the first and second tubes 41 and 42.

(2) When the cooling apparatus is inclined slightly (e.g., counterclockwise) (not shown), more particularly, when one end 41a of the first tube 41 is above the liquid level of the refrigerant 30 and the other end 41b is open below the refrigerant liquid level; however, both of one end 42a and the other end 42b of the second tube 42 are open above the refrigerant liquid level, the apparatus operates as follows. That is, both of one end 42a and the other end 42b of the second tube 42 can introduce the gaseous refrigerant therein, so that the refrigerant cannot circulate efficiently.

In the first tube 41, however, the gaseous refrigerant is hardly introduced from the other end 41b side, and therefore the gaseous refrigerant 30 which has been boiled and vaporized circulates along a route in the order of connection chamber, one end of the first tube, first tube, the other end of the first tube, and refrigerant tank. Thus, even when the apparatus is installed while being inclined, the refrigerant 30 can circulate through the first tube.

Advantages and effects according to this embodiment will be described.

In this embodiment, one end 41a of the first tube 41 (first radiator) is in communication with the central portion of the refrigerant tank 20, while the other end 41b thereof is in communication with one peripheral edge portion of the refrigerant tank. Similarly, one end 42a of the second tube 42 (second radiator) is in communication with the central portion of the refrigerant tank 20, while the other end 42b thereof is in communication with another peripheral edge portion other than the one peripheral edge portion, of the refrigerant tank 20. Therefore, even when the cooling apparatus is inclined, at least one of the other end 41b of the first tube and the other end 42b of the second tube can be immersed below the liquid level of the refrigerant 30. Thus, even when the apparatus is inclined, it is possible for the refrigerant to circulate efficiently. Further, it is possible to suppress the heat radiating performance from being deteriorated. Besides, the refrigerant tank may be installed in a horizontal direction or vertical direction, it is possible for the refrigerant to circulate efficiently.

When the inclination angle is small, it is possible to radiate heat efficiently by using both of the first and second tubes 41 and 42.

Moreover, since the first and second tubes 41 and 42 are brought into communication with the refrigerant tank through the connection chamber 23, it is possible to prevent one end of the first tube 41 and one end of the second tubes 42 from being located below the liquid level of the refrigerant even when the inclination angle is large.

Further, since in the interior of the refrigerant tank 20 is provided with the inner fins 21 extending from one peripheral edge side to another peripheral edge side, the flow of the refrigerant 30 in the tank 20 can be smoothed and hence it is possible for the refrigerant to circulate smoothly within the tank 20. The resulting increase of the heat transfer area also leads to an improvement of the heat transfer performance. By adopting as refrigerant tank 20 a flat tube having plural holes, formed by extruding from one peripheral edge side to another peripheral edge side, the inner fins 21 can be formed easily.

Since each of the first and second tubes 41 and 42 is constituted by a cylindrical member bent in a meandering shape, these tubes can be formed easily. Further, if a flat tube having plural holes, formed by extruding from one end side to the opposite end side, is adopted as the cylindrical member, the refrigerant can circulate through one of plural holes even when the apparatus is inclined in any direction. Thus, even when the apparatus is inclined, it is possible for the refrigerant to circulate efficiently. Further, it is possible to suppress the heat radiating performance from being deteriorated remarkably. Still further, it is possible for the refrigerant to circulate efficiently even when the refrigerant tank is disposed in the horizontal or vertical direction.

Further, since the semiconductor device 10 as a high-temperature medium is fixed to the central portion of the refrigerant tank 20, it is possible to transfer the heat of the semiconductor device efficiently when the apparatus is inclined.

A second embodiment of the present invention will be described.

Figure 3:
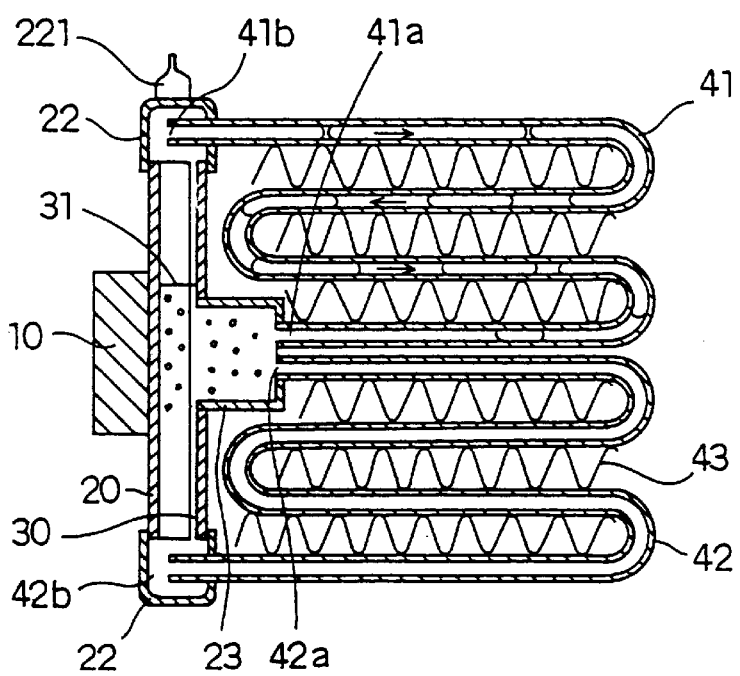
FIG. 3 is a front view of a cooling apparatus according to a second embodiment of the present invention.

FIG. 3 is a front view of the cooling apparatus of the second embodiment. Features of the second embodiment, which are different from the first embodiment, will be mainly described.

The second embodiment is different from the first embodiment in the installation angle. The cooling apparatus of this second embodiment, as shown in FIG. 3, is inclined up to an angle at which one end 41a of a first tube 41 is open below the liquid level of refrigerant 30, while the other end 41b thereof is open above the liquid level. In this case, both of one end 42a and the other end 42b of a second tube 42 are positioned below the refrigerant liquid level 31.

An operation of the cooling apparatus will be described below in detail.

In this embodiment, the refrigerant 30 after boiling and vaporization circulates along a route in the order of refrigerant tank 20, the other end 41b of the first tube, first tube 41, one end 41a of the first tube, connection chamber, and refrigerant tank 20. Thus, the refrigerant 30 can circulate by using the first tube.

In the second tube 42, since both of one end 42a and the other end 42b are positioned below the liquid level 31 of the refrigerant 30, a circulation of the refrigerant after been boiled and vaporized is hardly performed. In the interior of the second tube 42, however, the transfer of heat is performed by convection of the high-temperature refrigerant. The first tube 41 side may be inclined downward in such a manner that the gaseous refrigerant circulates in the second tube 42.

Advantages and effects according to the second embodiment will be described.

In this embodiment, one end 41a of the first tube 41 (first radiator) is in communication with the central portion of the refrigerant tank 20, while the other end 41b is in communication with one peripheral edge portion of the tank, further, one end 42a of the second tube 42 (second radiator) is in communication with the central portion of the refrigerant tank, and the other end 42b thereof is in communication with another peripheral edge portion other than from the one peripheral edge portion. Therefore, even when the cooling apparatus is inclined, one end 41b of the first tube can be immersed below the liquid level of the refrigerant 30. Thus, even when the apparatus is inclined, it is possible for the refrigerant to circulate efficiently. Further, it is also possible to suppress the heat radiating performance from being deteriorated. Besides, even when the refrigerant tank is installed in a horizontal direction or a vertical direction, it is possible for the refrigerant to circulate efficiently.

In this embodiment, the refrigerant 30 is filled into the refrigerant tank 20 until the other end 42b of the second tube 42 and the connection chamber 23 are immersed therein. However, the refrigerant 30 may be filled into the refrigerant tank to such an extent that, when the apparatus is inclined, the other end 42b of the second tube 42 is immersed in the refrigerant 30 (below the liquid level) while the connection chamber 23 is not immersed therein (above the liquid level) (not shown).

In this case, the refrigerant 30 after being boiled and vaporized circulates along a route in the order of refrigerant tank 20, connection chamber 23, one end 42a of the second tube, second tube 41, the other end 42b of the second tube, and refrigerant tank. In this way, the refrigerant 30 can circulate by using the second tube.

Thus, according to the second embodiment, even when the cooling apparatus is inclined, the refrigerant contained in the refrigerant tank can circulate efficiently, irrespective of the filling amount of the refrigerant, and it is possible to suppress the heat radiating performance from being deteriorated.

A third embodiment of the present invention will be described.

Figure 4:
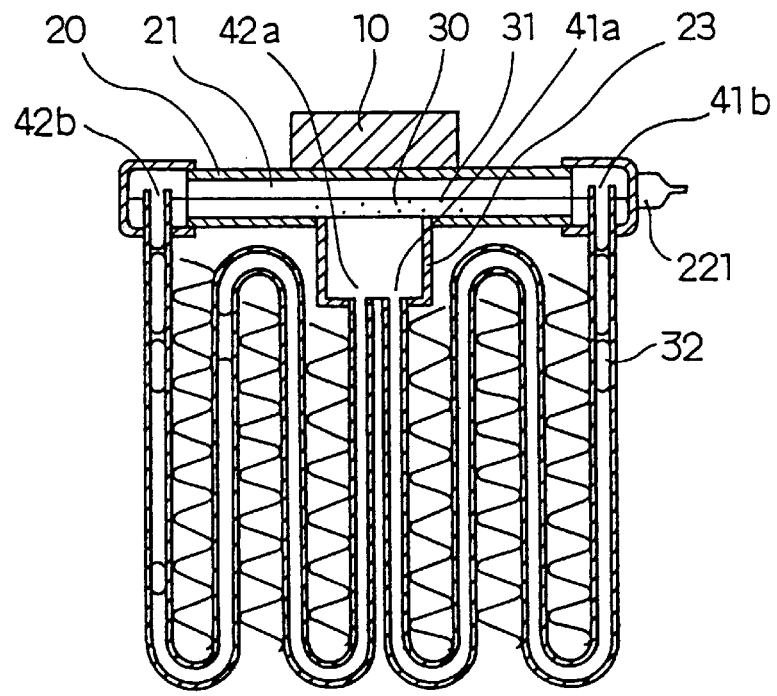
FIG. 4 is a front view of a cooling apparatus according to a third embodiment of the present invention.

FIG. 4 is a front view of the cooling apparatus of the third embodiment. Features of the third embodiment, which are different from the first embodiment, will be mainly described.

The third embodiment is different from the first embodiment in that the cooling apparatus of this embodiment is installed to be reversed upside and down against the cooling apparatus of the first embodiment. In the cooling apparatus of this third embodiment, one end 41a of a first tube 41 and one end 42a of a second tube 42 are open below the liquid level 31 of refrigerant 30, while the other ends 41b and 42b of the first and second tubes 41 and 42, respectively, are positioned below the liquid level 31 of the refrigerant, the liquid level 31 being in contact with inner fins 21.

In FIG. 4, the upper surface of a refrigerant tank 20 serves as a heat absorbing surface, to which is fixed a semiconductor device 10. On the inner surface of the refrigerant tank corresponding to the back side of the heat absorbing surface there are disposed inner fins 21 (a heat transfer member). The inner fins 21 are formed in the same manner as in the first embodiment, by perforating (a flat tube having plural holes) simultaneously when the tubular member is extruded, that is, the partition wall between the holes is used as an inner fin 21. Alternatively, the inner fins 21 may be formed such that, after a tubular member is formed by extruding and thereafter inserting fins are provided separately into the tubular member. It is not always necessary that the inner fins 21 be in contact with the inner surface of the refrigerant tank 20 opposed to the heat absorbing side. However, it is preferable that the inner fins 21 is in contact with the inner surface, because it is possible to transfer heat directly to the first and second tubes 41 and 42 through the inner fins 21.

The refrigerant 30 is filled into the refrigerant tank 20 in such a manner that the first and second tubes 41 and 42 and the connection chamber 23 are immersed in the refrigerant and that the inner fins 21 in the refrigerant tank 20 are partially positioned below the liquid level 31.

In this embodiment, the heat generated from the semiconductor 10 passes through the heat absorbing surface and is transmitted to the inner fins 21, and further is transmitted from the inner fins 21 to the refrigerant 30. Therefore, even when the cooling apparatus is turned upside down, it is possible to prevent the heat radiating performance from being deteriorated.

A fourth embodiment of the present invention will be described.

Figure 5:
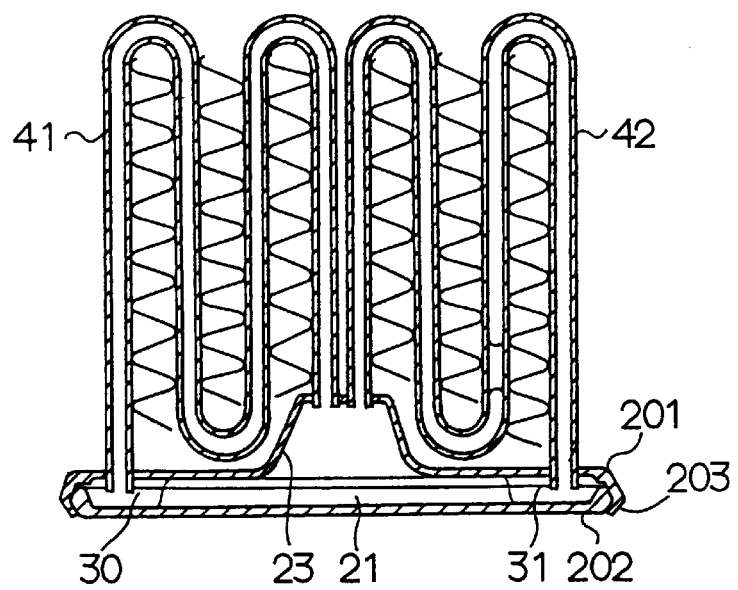
FIG. 5 is a front view of a cooling apparatus according to a fourth embodiment of the present invention.

FIG. 5 is a front view of the cooling apparatus of the fourth embodiment, and FIG. 6 is a perspective view showing components of the cooling apparatus. Features of the fourth embodiment, which are different from the first embodiment, will be mainly described.

Although the refrigerant tank 20 used in the first embodiment is constituted by a flat tubular member formed by extruding, a refrigerant tank 20 used in this embodiment is composed of two thin plate members 201 and 202 formed by pressing, as shown in FIG. 5. The thin plate members 201 and 202 can be formed of not only pressed blocks or plates but also by die-casted blocks.

As shown in FIG. 6, the thin plate member 201 constitutes an upper half of the refrigerant tank 20, and is made of, for example, a brazing sheet of aluminum. On the wall surface around the central portion of the thin plate member 201 and on the side opposite to the semiconductor device 10 is integrally formed a connection chamber 23 simultaneously when the thin plate member is pressed. In the thin plate member 201, opening holes are formed in the portions where the other ends 41b and 42b of first and second tubes 41 and 42, respectively, are to be connected. Opening holes are formed also in the portions where one ends 41a and 42a of the first and second tubes 41 and 42, respective, are to be connected. The peripheral edge portion of the thin plate member 201 is formed by bending and raising and is partially formed with crimping claws for caulking the thin plate member 202.

As shown in FIG. 6, the thin plate member 202 constitutes the lower half of the refrigerant tank 20, and is formed of aluminum for example. The peripheral edge portion of the thin plate member 202 is formed by bending and raising, with a hole being formed therein, and an inlet pipe 221 is fitted in the hole.

In the thin plate member 202, there are disposed inner fins 21 in the same direction as in the first embodiment. For example, the inner fins 21 are formed by pressing. The inner fins 21 may be pressed integrally with the thin plate member 202, or pressed separately from the thin plate member 202 and subsequently bonded to the thin plate member by brazing for example.

Since the cooling apparatus of this fourth embodiment operates in the same way as the cooling apparatus of the first embodiment, a description of an operation thereof is here omitted.

Figure 8:
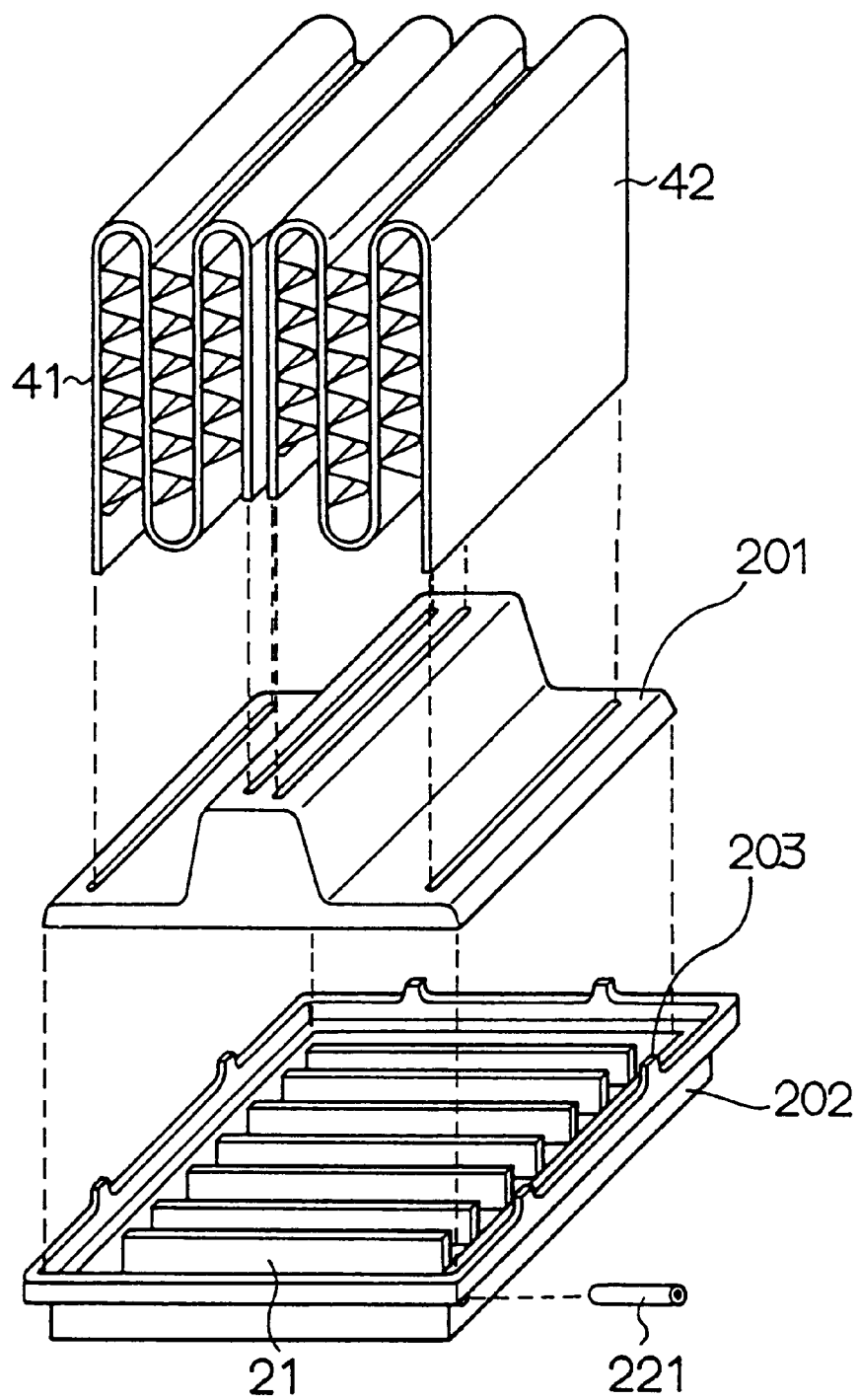
FIG. 8 is a perspective view showing components thereof.

Although in this embodiment the crimping claws 203 are formed on the thin plate member 201 side, these criming claws may be formed on the thin plate 202 side, as shown in FIG. 7 and FIG. 8 which are perspective views showing components of the cooling apparatus.

In this embodiment, one end 41a of the first tube 41 (first radiator) is in communication with the central portion of the refrigerant tank 20, and the other end 41b thereof is in communication with one peripheral edge portion of the refrigerant tank, while one end 42a of the second tube 42 (second radiator) is in communication with the central portion of the refrigerant tank 20, and the other end 42b thereof is in communication with another peripheral edge portion other than the one peripheral edge portion. According to this construction, even when the cooling apparatus is inclined, at least one of the other ends 41b and 42b of the first and second tubes, respectively, can be immersed below the liquid level of the refrigerant 30. Thus, as in the first embodiment, even when the cooling apparatus is inclined, it is possible for the refrigerant to circulate efficiently. Further, it is also possible to suppress the heat radiating performance from being deteriorated. Besides, even when the refrigerant tank is inclined in a horizontal direction or a vertical direction, the refrigerant can circulate efficiently.

In this embodiment, moreover, since the connection chamber 23 is formed integrally with the thin plate member 201, it is possible to omit the formation of the connection chamber 23 and the bonding between the connection chamber 23 and the refrigerant tank 20. Thus, the connection chamber 23 can be formed easily.

A fifth embodiment of the present invention will be described.

Features of the fifth embodiment, which are different from the fourth embodiment, will be mainly described.

The fifth embodiment is different from the fourth embodiment in the inner fins 21.

Figure 9:
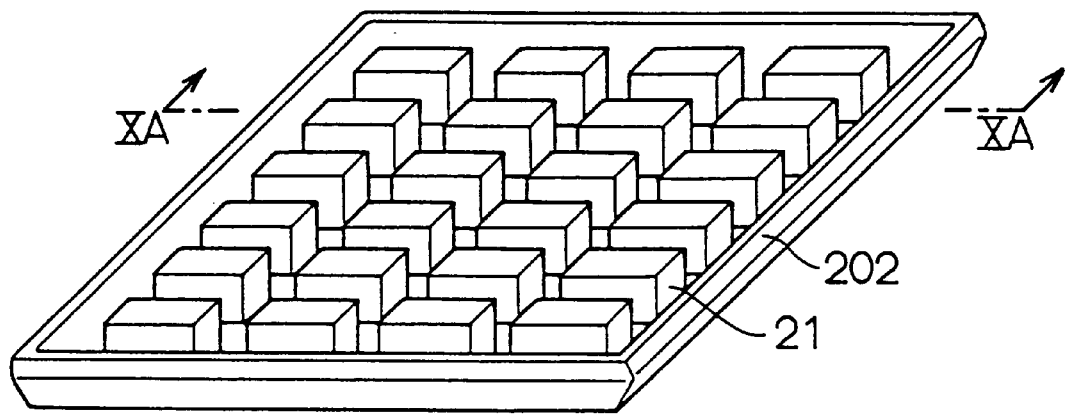
FIG. 9 is a perspective view showing inner fins used in a cooling apparatus according to a fifth embodiment of the present invention.
Figure 10A:
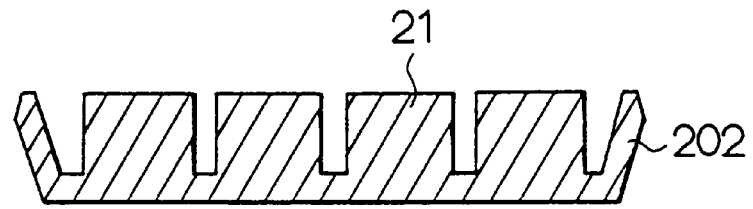
FIG. 10A is cross sectional views taken along line XA—XA of the inner fins shown in FIG. 9.

FIG. 9 is a perspective view showing inner fins 21 used in this fifth embodiment, and FIG. 10A is a cross sectional view taken along line XA—XA of FIG. 9.

As shown in FIG. 9, the inner fins 21 includes a plurality of pressed plate members for forming a thin plate member 202 which constitutes a lower half of a refrigerant tank 20, with plural slits (notches) being formed in the those plate members as shown in the same figure. These slits are formed in the same positions as slits of adjacent plate members. Thus, slits are formed in a matrix shape together with the slits between adjacent plate members.

Figure 10B:
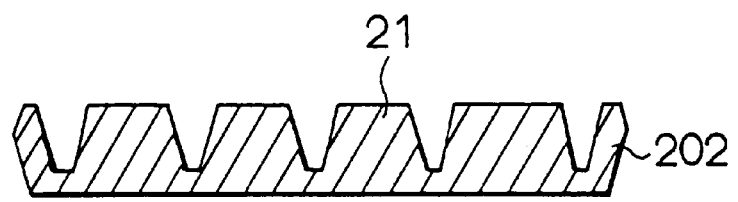
FIG. 10B is a modification of the inner fins of FIG. 10A.

The cross section of each plate member for constituting the inner fins 21 is rectangular as shown in FIG. 10A; however, it may be trapezoidal as shown in FIG. 10B. The trapezoidal shape is preferable to be pressed.

Thus, since the inner fins used in this embodiment are constituted by plate members having plural slits (notches), when the refrigerant tank 20 is inclined or disposed in a substantially vertical direction as in the second embodiment, even if the longitudinal direction of the plate members is disposed parallel to a horizontal direction or inclined or disposed in a substantially vertical direction, it is possible to improve the relief (upward movement) of bubbles of the refrigerant 30. Consequently, even when the refrigerant tank is inclined, the refrigerant can circulate efficiently, and it is possible to suppress the heat radiating performance from being deteriorated remarkably.

The shape of the inner fins 21 is not limited to the one shown in FIG. 10A. For example, it may be any of the shapes shown in FIGS. 11 to 14.

Figure 11:
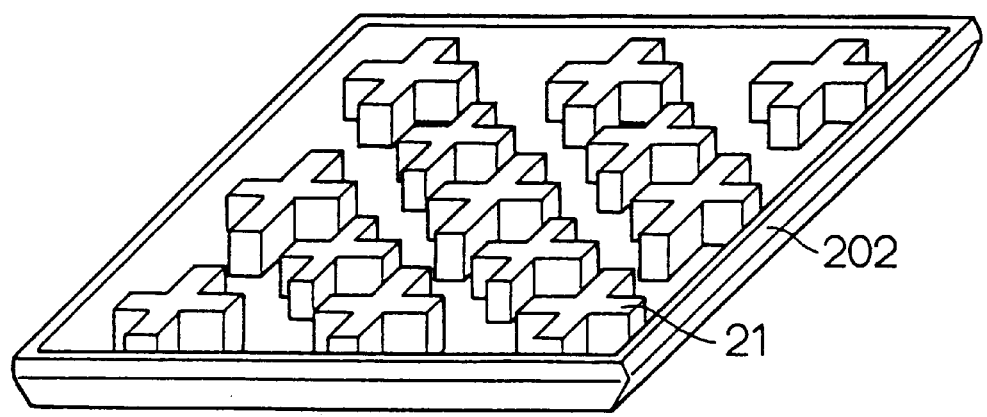
FIG. 11 is a perspective view showing another construction of inner fins in the fifth embodiment.

Inner fins 21 shown in FIG. 11 include a plurality of plate members formed by pressing integrally with the thin plate member 202 which constitutes a lower half of the refrigerant tank 20. As shown in FIG. 11, each plate member is formed in a generally cross shape. A plurality of generally cross-shaped plate members are disposed such that straight portions thereof are perpendicular and parallel to one another. As a result, notches are formed continuously also in an oblique direction, as shown in FIG. 11; that is, even when the refrigerant tank 20 is inclined, the refrigerant can circulate efficiently, and it is possible to suppress the heat radiating performance from being deteriorated remarkably.

Figure 12:
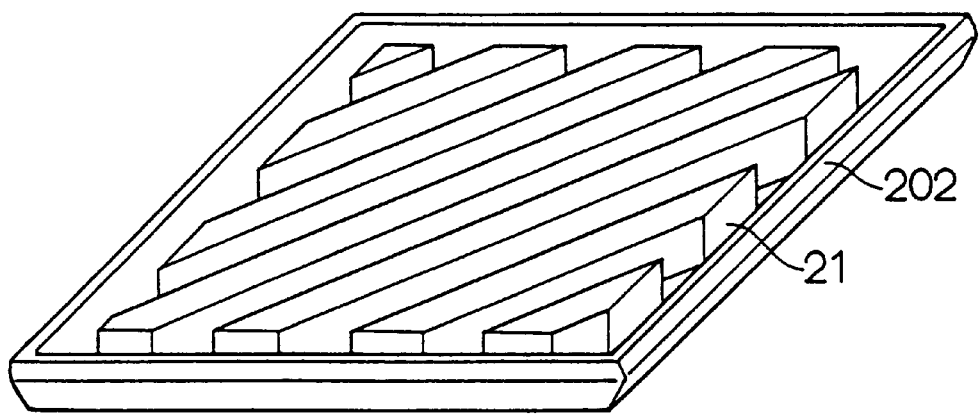
FIG. 12 is a perspective view showing a further construction of inner fins in the fifth embodiment.

Inner fins 21 shown in FIG. 12 include a plurality of plate members formed by pressing integrally with the thin plate member 202 which constitutes a lower half of the refrigerant tank 20. As shown in FIG. 12, each plate member is inclined from one peripheral edge side of the refrigerant tank 20 (the other end side 41b of the first tube 41) to another peripheral edge side thereof (the other end 42b side of the second tube 42). Therefore, even when the refrigerant tank 20 is inclined, the refrigerant 30 which has become high in temperature, or bubbles can be moved to the refrigerant liquid level 31 side efficiently. Consequently, in comparison with the first embodiment, the flow of refrigerant in the refrigerant tank can be smoothed more efficiently and the refrigerant can circulate in the tank smoothly.

Figure 13:
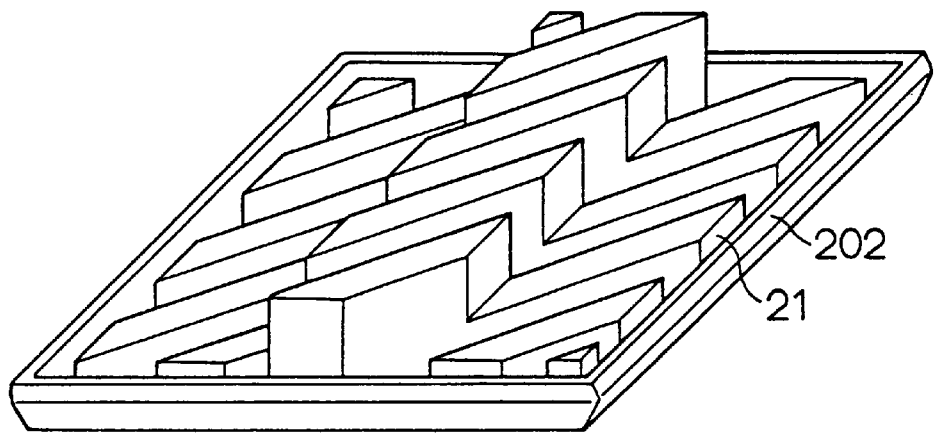
FIG. 13 is a perspective view showing a still further construction of inner fins in the fifth embodiment.

Inner fins 21 shown in FIG. 13, similar to the inner fins 21 shown in FIG. 12, include a plurality of plate members formed by pressing integrally with the thin plate member 202 which constitutes a lower half of the refrigerant tank 20. As shown in FIG. 13, each plate member is inclined from one peripheral edge side of the refrigerant tank 20 (the other end 41b side of the first tube 41) to another peripheral edge side thereof (the other end 42b side of the second tube 42). A portion of each plate member opposed to the connection chamber 23 (see FIGS. 5 to 8) is formed longer than a portion thereof not opposed to the connection chamber.

Figure 14:
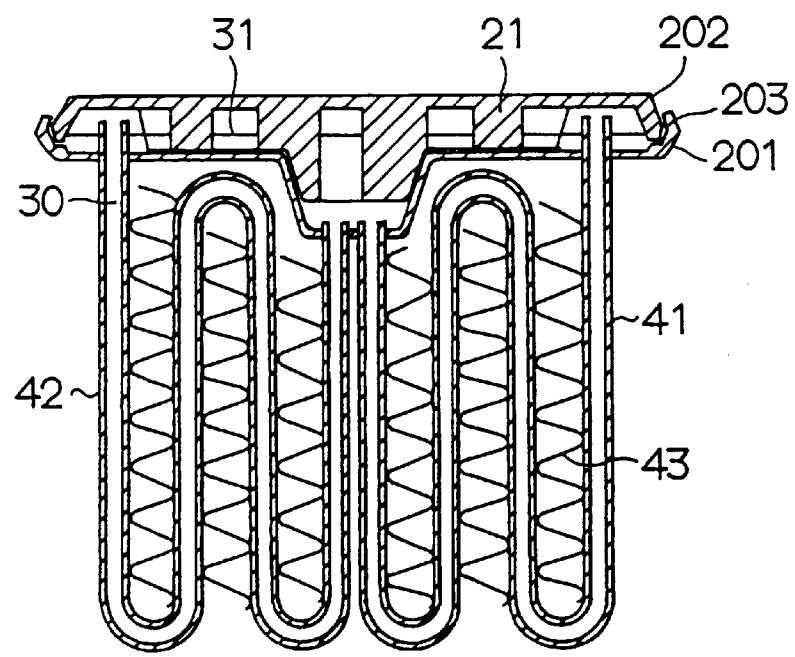
FIG. 14 is a front view of a cooling apparatus to which the inner fins shown in FIG. 13 is applied.

FIG. 14 is a front view of the cooling apparatus shown in FIGS. 5 and 6, to which the inner fins 21 shown in FIG. 13 are applied and in which the refrigerant tank 20 is reversed upside down as in the embodiment shown in FIG. 4. A long portion of the inner fins 21 is partially extended into the connection chamber 23. In this case, as in the embodiment shown in FIG. 4, the heat generated from the semiconductor device 10 passes through the heat absorbing surface and is transmitted to the inner fins 21 and further to the refrigerant 30. In the case of the inner fins 21 shown in FIG. 13, since the portion which is immersed in the refrigerant 30 is large, heat can be transferred to the refrigerant 30 efficiently. Therefore, even when the cooling apparatus is reversed upside down, it is possible to suppress the heat radiating performance from being deteriorated remarkably.

A sixth embodiment of the present invention will be described.

Figure 15:
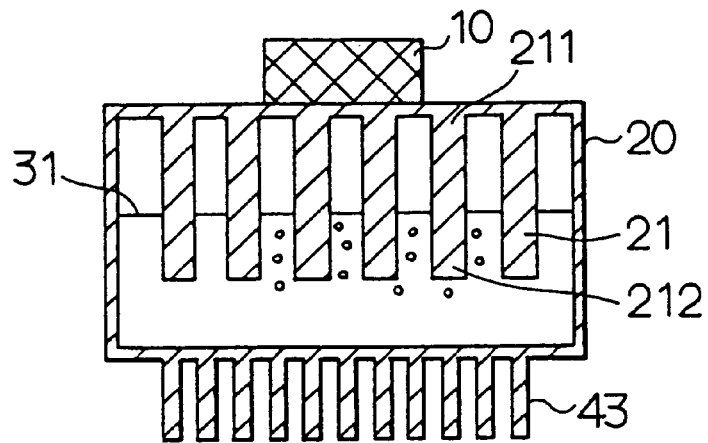
FIG. 15 is a front view of a cooling apparatus according to a sixth embodiment of the present invention.

FIG. 15 is a front view of the cooling apparatus of the sixth embodiment.

The cooling apparatus of the sixth embodiment includes a semiconductor device (a high-temperature medium, a heat generating element) 10, a refrigerant tank 20 to which the semiconductor device 10 is fixed, a refrigerant 30 sealed into the refrigerant tank 20, inner fins (a heat transfer member) 21 disposed within the refrigerant tank 20, and heat radiating fins 43 fixed to the refrigerant tank 20 for radiating heat absorbed by the refrigerant 30 to the outside.

The semiconductor device 10 generates heat when an electric current is supplied thereto, and may be a power semiconductor device used in a computer or a semiconductor device which generates a large heat amount, such as a processing unit.

The refrigerant tank 20 is, for example, a box formed by pressing aluminum. An upper surface of the refrigerant tank 20 is formed as a heat absorbing surface, to which the semiconductor device 10 is fixed by using, for example, a threaded member (screw) or an engaging member (rivet).

The refrigerant 30 is, for example, of a fluorocarbon type refrigerant such as $C_6F_{14}$, or water, or HFC-134a as substitute flon.

A portion of the inner fins 21 is connected to the back surface of the heat absorbing surface of the refrigerant tank 20 and the other portion thereof is positioned within the tank 20 to transfer heat from the heat absorbing surface to the refrigerant 30. The inner fins 21 include a plurality of plate- or rod- like members connected to the back surface of the heat absorbing surface. The inner fins 21 are disposed so as to be partially positioned below the liquid level of the refrigerant even when the refrigerant tank is reversed upside down or inclined at any angle. In this embodiment, when the semiconductor device is fixed to the upper side of the refrigerant tank, as shown in FIG. 15, the lower end portions of the inner fins 21 are positioned below the liquid level 31 of the refrigerant; when the refrigerant tank in FIG. 15 is reversed by 90 degrees in a clockwise direction, the right-hand inner fin 21 is positioned below the refrigerant liquid level 31; when the refrigerant tank in FIG. 15 is reversed by 90 degrees in a counterclockwise direction, the left-hand inner fin 21 is positioned below the refrigerant liquid level 31; and also when the refrigerant tank in FIG. 15 is reversed upside down, the heat absorbing side portions of the inner fins 21 are positioned below the liquid level 31. Thus, the above-described condition is satisfied.

The heat radiating fins 43 include a plurality of plate or rod members fixed to the side opposite to the heat absorbing side of the refrigerant tank 20.

According to this embodiment, since the inner fins 21 are disposed within the refrigerant tank so as to be partially positioned below the refrigerant liquid level 31 when the refrigerant tank 20 is reversed upside down or inclined at any angle, the heat from the high-temperature medium can be surely transferred to the refrigerant when the apparatus may be installed at any angle. Therefore, it is possible to suppress the heat radiating performance from being deteriorated.

Figure 16:
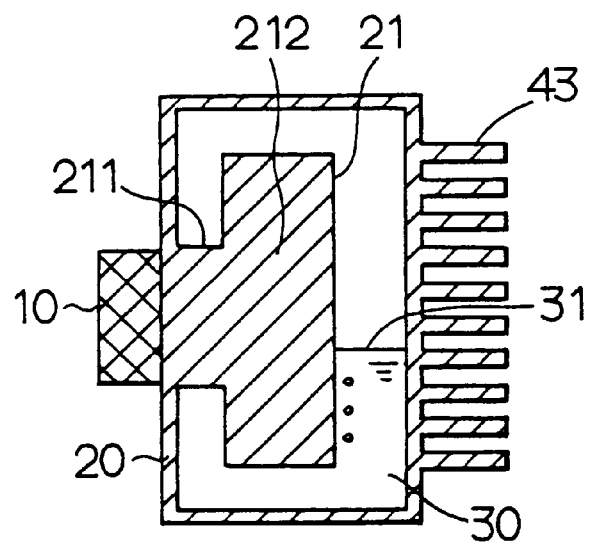
FIG. 16 is a perspective view showing a modification of the cooling apparatus of the sixth embodiment.

The shape of the inner fins 21 is not limited to the one shown in FIG. 15 but may be a shape as shown in FIG. 16. The inner fin 21 shown in FIG. 16 includes a fixing portion 211 connected to the heat absorbing surface and having a predetermined cross sectional area which is preferably almost equal to or larger than the fixing area of the semiconductor device, and an inner heat radiating portion 212 having a cross sectional area larger than that of the fixing portion 211. As shown in FIG. 16, the inner heat radiating portion 212 is elongated in a vertical direction of the sheet so as to be longer than the fixing portion 211. The inner heat radiating portion 212 other than the fixing portion 211 is spaced from the inner wall surfaces of the refrigerant tank 20 with a predetermined distance, which is smaller than half, preferably one-third or less, more preferably one-fourth or less, of the distance between opposed wall surfaces of the tank 20. Also in the shape shown in FIG. 16, the heat generated from the semiconductor device 10 can be surely transferred to the refrigerant even when the refrigerant tank 20 is reversed upside down or inclined at any angle. Thus, it is possible to suppress the heat radiating performance from being deteriorated.

A seventh embodiment of the present invention will be described.

Figure 17:
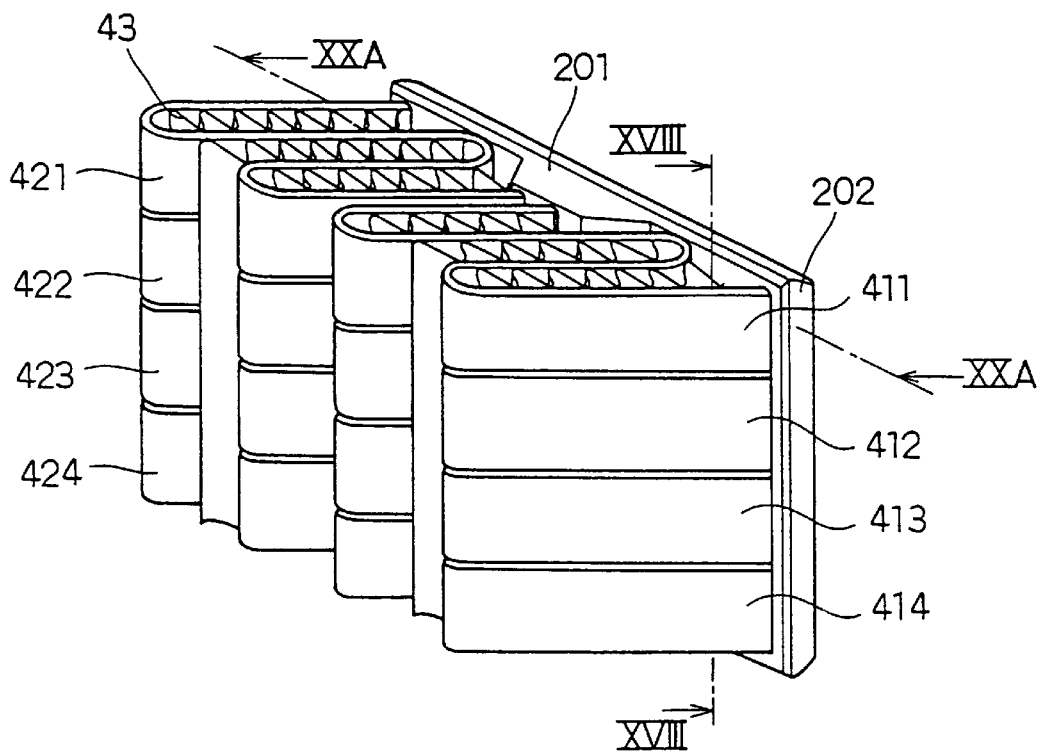
FIG. 17 is a perspective view of a cooling apparatus according to a seventh embodiment of the present invention.
Figure 18:
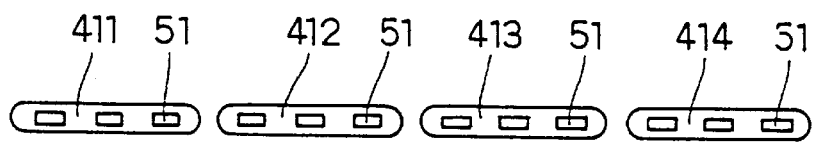
FIG. 18 is a cross sectional view taken along line XVIII—XVIII of a refrigerant tank used in the cooling apparatus of the seventh embodiment.
Figure 19:
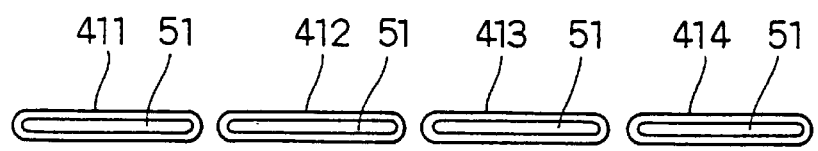
FIG. 19 is a cross sectional view taken along line XIX—XIX of a refrigerant tank according to a modification thereof.
Figure 20A:
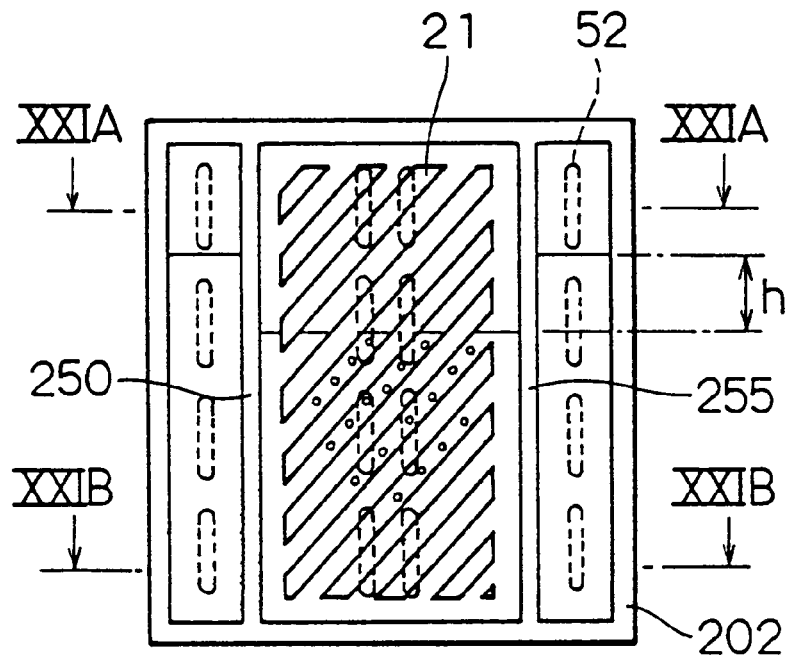
FIG. 20A is a cross sectional view taken along line XXA—XXA in FIG. 17.
Figure 20B:
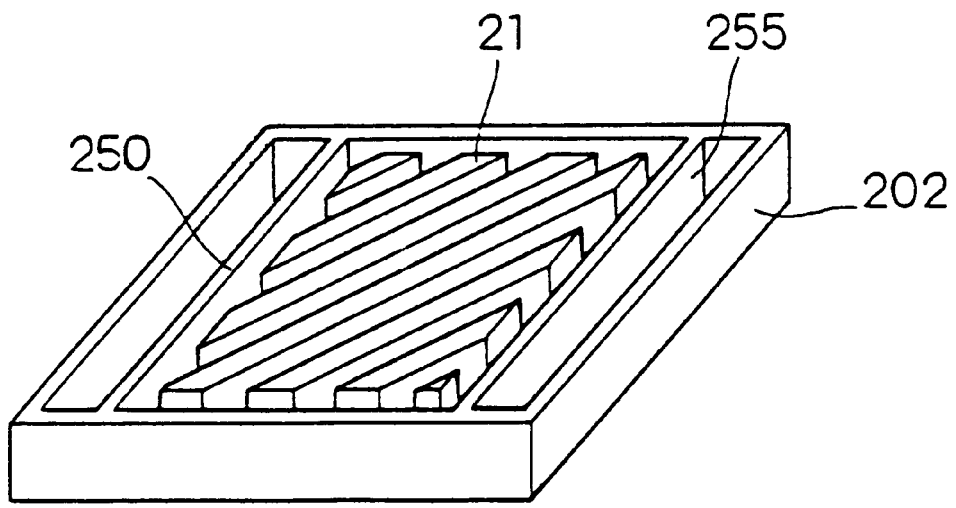
FIG. 20B is an explanatory view thereof.
Figure 21A:
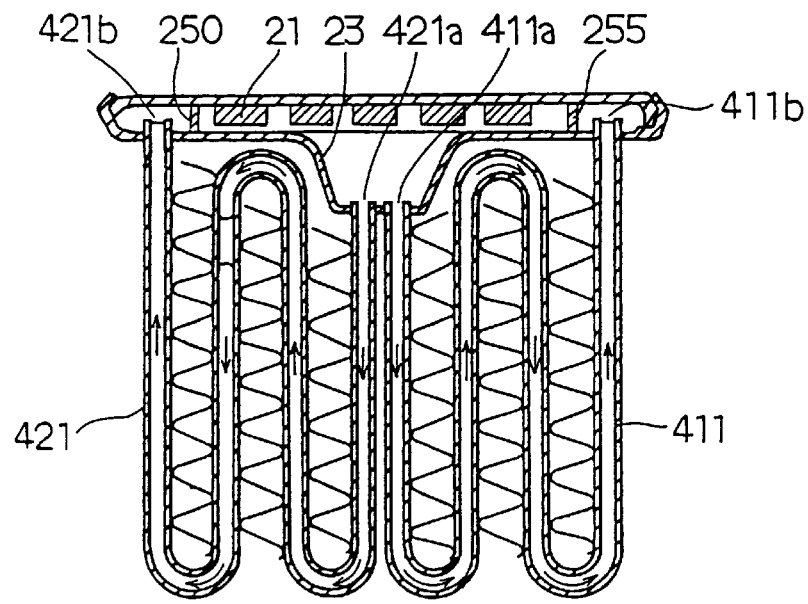
FIG. 21A is a cross sectional view taken along line XXIA—XXIA in FIG. 20A.
Figure 21B:
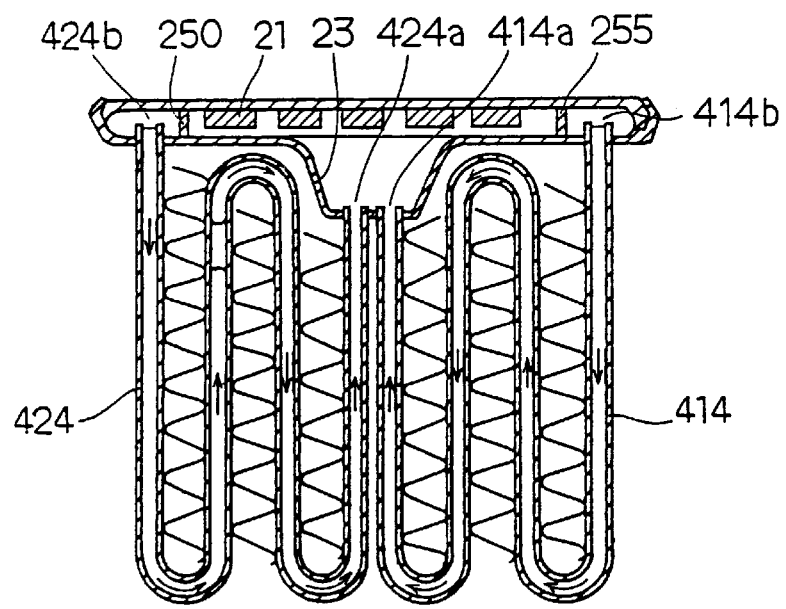
FIG. 21B is a cross sectional view taken along line XXIB—XXIB in FIG. 20B.

FIG. 17 is a perspective view of the cooling apparatus of the seventh embodiment, FIG. 18 is a cross sectional view taken along line XVIII—XVIII of FIG. 17, FIG. 19 shows a modification of FIG. 18, FIG. 20A is a cross sectional view taken along line XXB—XXB of FIG. 17, FIG. 20B is a perspective view depicting the contents of a refrigerant tank 202, FIG. 21A is a cross sectional view taken along line XXIA—XXIA of FIG. 20A, and FIG. 21B is a cross sectional view taken along line XXIB—XXIB of FIG. 20A.

In the cooling apparatus of this embodiment, a refrigerant tank 20 is used to stand (disposed vertically). The construction of the apparatus is similar to that of the cooling apparatus shown in FIG. 6. Features of the seventh embodiment, which are different from the cooling apparatus shown in FIGS. 5 and 6, will be mainly described.

As shown in FIG. 17, a first tube 41 includes a plurality of flat tube members 411, 412, 413 and 414 formed by extruding and disposed side by side in the same longitudinal direction. Similarly, a second tube 42 includes a plurality of flat tube members 421, 422, 423 and 424 formed by extruding and disposed side by side in the same longitudinal direction.

When the cooling apparatus is disposed vertically (the tube members 411 to 414 constituting the first tube and the tube members 421 to 424 constituting the second tube are disposed in the vertical direction), as shown in FIG. 17, the top, second, third and bottom stages of tube members 411–414 of the first tube and like tube members 421–424 of the second tube are disposed such that one ends thereof (the portions connected to peripheral edge portions of the refrigerant tank) and the other ends (the portions connected to the central portion of the refrigerant tank) are substantially positioned horizontally.

Within each of the tube members 411 to 414 and 421 to 424, there are formed a plurality of small passages 51, as being seen from an internal cross sectional view of FIG. 18. However, a single small passage 51 may be formed in each of the tube members, as shown in FIG. 19.

The refrigerant tank 20 is composed of, for example, a box-shaped member formed by die-casting with aluminum. In an interior of the refrigerant tank 20 are formed inner fins 21 (heat transfer member) which smooth the flow of refrigerant 30 in the refrigerant tank 20 and increase the internal surface area. As shown in FIGS. 20A and 20B, the inner fins 21 are disposed in an inclined direction relative to side faces of the refrigerant tank 20 (at an angle of approximately 45 degrees relative to the side faces in FIG. 20). The semiconductor device 10 is fixed to the bottom side (heat absorbing side) of the central portion of the refrigerant tank 20 using, for example, a threaded member (screw) or an engaging member (rivet).

As shown in FIGS. 20A and 20B, between the central portion and one peripheral edge portion in the refrigerant tank 20 is provided a first partition wall 250 which is a plate member serving as a partition between the central portion and the one peripheral edge portion. Both ends of the first partition wall 250 are connected to inner walls of the refrigerant tank 20 to provide a complete separation between the central portion and the one peripheral edge portion in the refrigerant tank. Further, between the central portion and the other peripheral edge portion opposite to the one peripheral edge portion in the refrigerant tank 20 there is provided a second partition wall 255 which is a plate member serving as a partition between the central portion and the other peripheral edge portion. The second partition wall 255 is connected at both ends thereof to inner walls of the refrigerant tank 20 to provide a complete separation between the central portion and the other peripheral edge portion in the refrigerant tank. Consequently, the space (hereinafter referred to as "the central space") including the central portion in the refrigerant tank 20 and the spaces (hereinafter referred to as "the peripheral edge spaces") are connected together through only the small passages 51 formed within the tube members 411 to 414 and 421 to 424. A plurality of fitting openings 52 are formed in a thin plate member 202 of the refrigerant tank 20 on the side opposite to the heat generating element mounted side, and opening portions of the tube members 411–414 and 421–424 are respectively fitted in the fitting openings 52.

An operation of this embodiment will be described below.

In FIG. 20, when the heat generating element (not shown) fixed to the central portion of the thin plate member 202 of refrigerant tank 20 generates heat, the refrigerant is boiled and vaporized in the central space within the tank 20, and the space is then filled with the refrigerant vapor. An internal pressure of the central space becomes higher than that when no heat is generated from the heat generating element. Because of an increase of pressure in the upper portion of the refrigerant tank caused by boiling and vaporization of the refrigerant and a decrease of pressure caused by condensation of the refrigerant 30, there occurs a difference of height "h" between the liquid level of the refrigerant in the central space of the refrigerant tank 20 and that in the peripheral edge spaces.

As a result, in the interiors of the tube member 411 and the tube member 421 which are located above both of the refrigerant liquid level in the central space of the refrigerant tank and the refrigerant liquid level in the peripheral edge spaces of the tank, the refrigerant vapor flows like arrows in the tubes 411 and 421, as shown in FIG. 21A. That is, the refrigerant vapor flows in the order of connection chamber 23 in the central space, one ends 411a and 421a of the tube members 411 and 421, small passages 51 in the tube members, the other ends 411b and 421b of the tube members 411 and 421, and peripheral edge spaces in the refrigerant tank 20. In the tube members 411 and 421, the refrigerant which has been boiled and vaporized in the central space releases latent heat, is condensed, and becomes low in temperature when reaching the other ends 411b and 421b.

On the other hand, in the interiors of the tube members 414 and 424 which are located below both of the refrigerant liquid level in the central space of the refrigerant tank and the refrigerant liquid level in the peripheral edge spaces, the refrigerant flows like arrows in the tube members 414 and 424, as shown in FIG. 21B. That is, the refrigerant flows in the order of peripheral edge spaces in the refrigerant tank 20, the other ends 414b and 424b of the tube members 414 and 424, small passages 51 in the tube members, one ends 414a and 424a of the tube members 414 and 424, connection chamber 23 in the central space. Thus, the low-temperature refrigerant in the peripheral edge spaces further releases heat while passing again through the tube members, and when the refrigerant returns to the connection chamber 23 formed in the central space, a temperature of the refrigerant becomes extremely low in comparison with the temperature of the refrigerant just after being boiled.

Thus, upon generation of heat from the heat generating element, the refrigerant circulates while being boiled and condensed by using both upper and lower tube members. In this way, the heat generated from the heat generating element can be released to the outside efficiently.

An eighth embodiment of the present invention will be described.

Figure 22A:
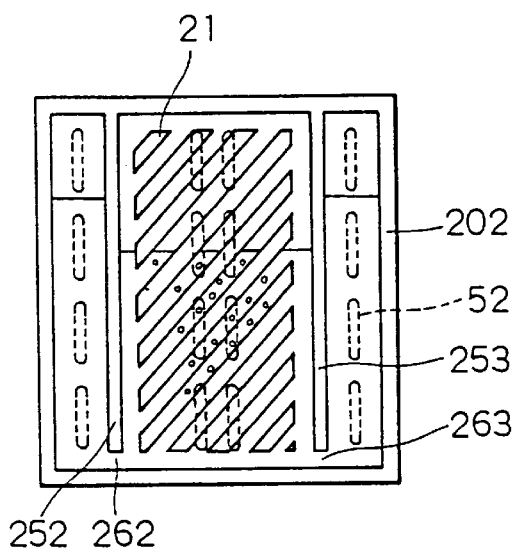
FIGS. 22A and 22B are partial cross sectional views of eighth embodiment of the present invention.
Figure 22B:
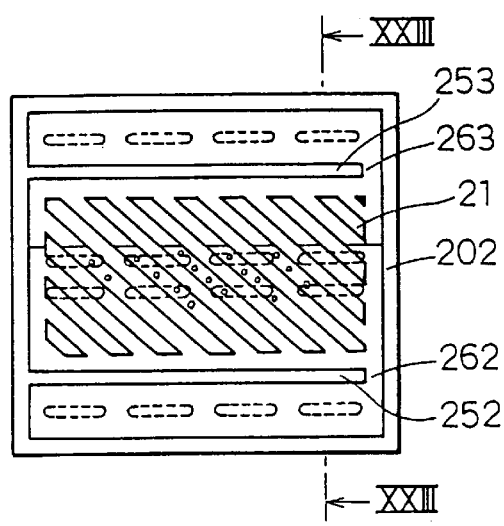
Figure 23:
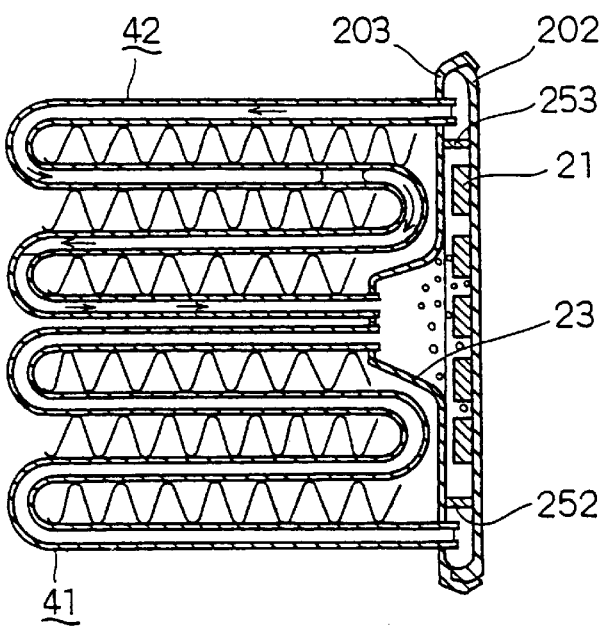
FIG. 23 is a cross sectional view taken along line XXIII—XXIII in FIG. 22B.

FIG. 22A is a partial cross sectional view of the cooling apparatus of the eighth embodiment, FIG. 22B is an explanatory view thereof, and FIG. 23 is a cross sectional view taken along line XXIII—XXIII of FIG. 22B.

The cooling apparatus in this embodiment is different from the cooling apparatus shown in FIG. 17 only in the construction of first and second partition walls. The other portions are the same to those in FIG. 17. Features of the eighth embodiment, which are different from the cooling apparatus shown in FIG. 17, will be mainly described.

As shown in FIGS. 22A and 22B, a first partition wall 253 constituted by a plate member and functioning to partition between the central portion and one peripheral edge portion in the refrigerant tank 20 is provided between the central portion and the one peripheral edge portion. One end portion of the first partition wall 253 is connected to an inner wall of the refrigerant tank 20, while the other end portion is separated from an inner wall of the same tank. This separated area provides an opening portion 263. Further, a second partition wall 252 constituted by a plate member and functioning to partition between the central portion in the refrigerant tank 20 and the other peripheral edge portion opposed to the one peripheral edge portion is provided between the central portion and the other peripheral edge portion. One end portion of the second partition wall 252 is connected to an inner wall of the refrigerant tank 20, while the other end portion is separated from an inner wall of the same tank. This separated area provides an opening portion 262.

In FIG. 22A, the refrigerant tank 20 is used to stand, and one end portions of the first and second partition walls 253 and 252 connected to an inner wall of the refrigerant tank 20 are located above the refrigerant liquid level, while the other end portions thereof separated from an inner wall of the refrigerant tank are located below the refrigerant liquid level.

In FIG. 22B, the cooling apparatus of the construction shown in FIG. 22A has been rotated by 90 degrees while the refrigerant tank 20 is disposed to stand.

An operation of this embodiment will be described below.

As shown in FIG. 22A, in the case where the refrigerant tank 20 is used to stand such that both opening portions 262 and 263 of the partition walls 252 and 253 are positioned below, when a heat generating element (not shown) generates heat, the central space of the refrigerant tank 20 is filled with boiled refrigerant vapor because one end portions of the partition walls located above the refrigerant liquid level are connected to an inner wall of the refrigerant tank, and the internal pressure of the central space becomes higher than that when no heat is generated from the heat generating element. Because of an increase of pressure in the upper portion of the refrigerant tank 30 caused by boiling and vaporization of the refrigerant and a decrease of pressure caused by condensation in the refrigerant tank, there occurs a difference in height between the refrigerant liquid level in the central space of the refrigerant tank and the refrigerant liquid level in the peripheral edge spaces of the tank.

As a result, in the interiors of the tube member 411 and the tube member 421 which are located above both of the refrigerant liquid level in the central space of the refrigerant tank 20 and the refrigerant liquid level in the peripheral edge spaced of the tank, the refrigerant flows like arrows in the tube members 411 and 421, as shown in FIG. 21A. That is, the refrigerant flows in the order of connection chamber 23 in the central space, one ends 411a and 421a of the tube members 411 and 421, small passages 51 in the tube members, the other ends 411b and 421b of the tube members 411 and 421, and peripheral edge spaces in the refrigerant tank 20.

On the other hand, in the interiors of the tube member 414 and the tube member 424 which are located below both of the refrigerant liquid level in the central space of the refrigerant tank 20 and the refrigerant liquid level in the peripheral edge spaces of the same tank, the refrigerant flows like arrows in the tube members 414 and 424, as shown in FIG. 21B. That is, the refrigerant flows in the order of peripheral edge spaces in the refrigerant tank 20, the other ends 411b and 421b of the tube members 411 and 421, small passages 51 in the tube members, one ends 411a and 421a of the tube members 411 and 421, and connection chamber 23 in the central space. At the same time, since the other end portions of the first and second partition walls are separated from an inner wall of the refrigerant tank 20 to form opening portions 262 and 263 in the separated areas, the refrigerant which has been condensed and reached the peripheral edge spaces moves to the connection chamber 23 in the central space also through the openings 262 and 263.

Thus, in the same way as in the seventh embodiment, upon generation of heat from the heat generating element, the refrigerant circulates while being boiled and condensed by using both upper and lower tube members. In this way, the heat generated from the heat generating element can be released to the outside efficiently.

When one (263) of the opening portions 262 and 263 is located above the refrigerant liquid level and the other (262) located below the liquid level as in FIG. 22B, the operation is the same as that of the first tube 41 in the cooling apparatus shown in FIG. 3. That is, as shown in FIG. 23, the refrigerant which has been boiled and vaporized in the central space passes through the opening 263 and reaches one ends 411a–414a of the first tube (tube members 411–414), and then flows into the tube members 411–414. Within the tube members, the refrigerant releases heat to the inner walls of the tube members and is condensed. Then, the refrigerant reaches the other ends 411b–414b of the first tube, returns to the central space, and is boiled therein again.

The operation of the second tube 42 (tube members 421–424) is basically the same as that of the second tube 42 used in the cooling apparatus of FIG. 3; however, is different therefrom only in that the refrigerant moves through the opening portion 263; and therefore, a description thereof is omitted.

The cooling apparatus of this embodiment can be installed horizontally (the same installation as in FIG. 1) because the cooling apparatus has the opening portions 262 and 263.

A ninth embodiment of the present invention will be described.

Figure 24A:
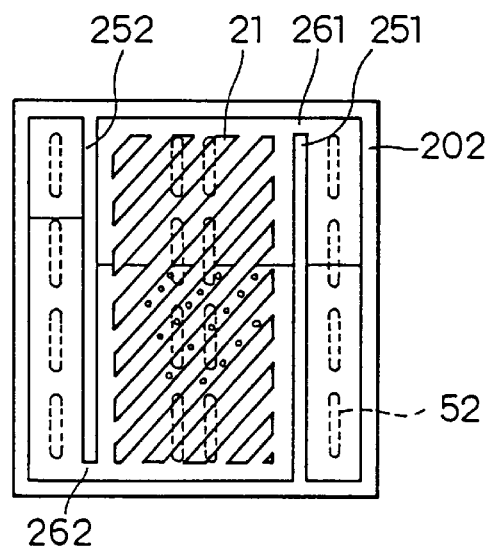
FIG. 24A is a partial cross sectional view of a refrigerant tank used in a cooling apparatus according to a ninth embodiment of the present invention.
Figure 24B:
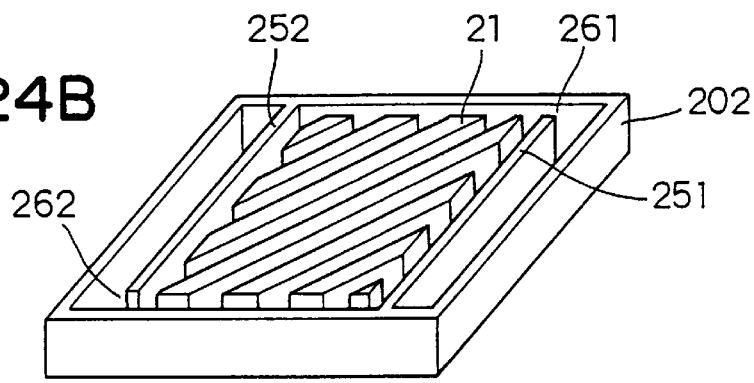
FIG. 24B is an explanation view of FIG. 24A.
Figure 25:
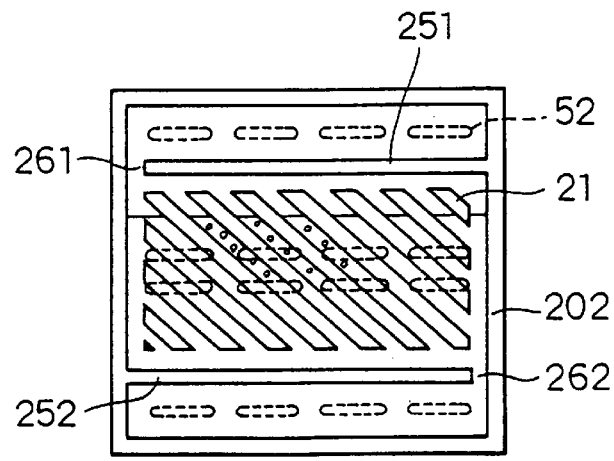
FIG. 25 is a partial cross sectional view in the ninth embodiment.

FIG. 24A is a partial cross sectional view of the cooling apparatus of the ninth embodiment, FIG. 24B is a perspective view depicting the interior of a refrigerant tank 20, and FIG. 25 is an explanatory view thereof.

The cooling apparatus of this embodiment is different from the cooling apparatus shown in FIG. 22 only in the construction of a first partition wall 251. The other portions are the same as those in FIG. 22. Features of the ninth embodiment, which are different from the cooling apparatus shown in FIG. 22, will be mainly described.

As shown in FIGS. 24A and 24B, opening portions 261 and 262 are positioned on a diagonal line in such a manner that first and second partition walls 251 and 252 are in point symmetry with respect to a central point of the refrigerant tank 20.

In this way, even if the construction of FIG. 24A is reversed upside down (180 degrees), one end portion of one partition wall is located above the refrigerant liquid level and connected to an inner wall of the refrigerant tank, while the other end portion thereof is located below the refrigerant liquid level. The same operation as described in connection with FIG. 17 is performed at one partition wall. In this embodiment, therefore, the heat can radiated efficiently even when the apparatus is reversed upside down (180 degrees), in addition to the effects obtained by the cooling apparatuses shown in FIGS. 17 and 22.

In the case where one (261) of the openings 261 and 262 is located above the refrigerant liquid level and the other (262) located below the level, as shown in FIG. 25, the operation is basically the same as that of the first tube 41 in the cooling apparatus shown in FIG. 22B; and therefore, a description thereof is here omitted.

A tenth embodiment of the present invention will be described.

Figure 26A:
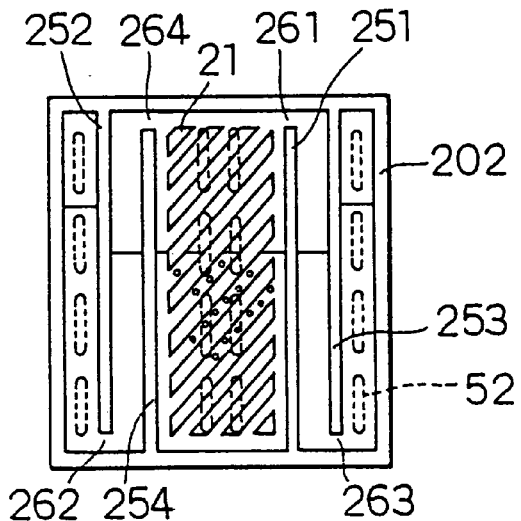
FIGS. 26A to 26C are partial cross sectional views of a refrigerant tank used in a cooling apparatus according to a tenth embodiment of the present invention.
Figure 26B:
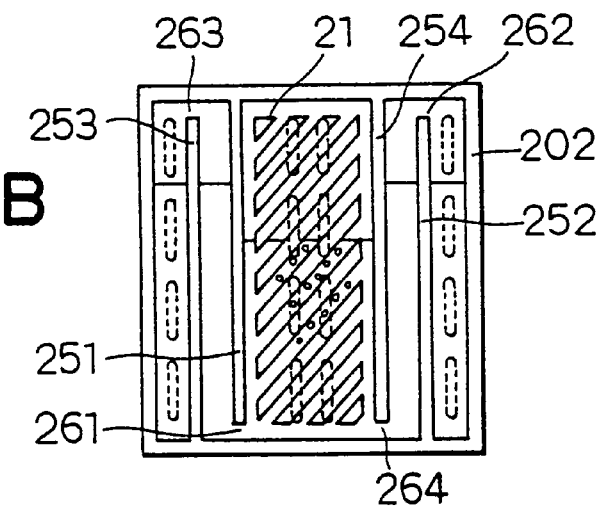
Figure 26C:
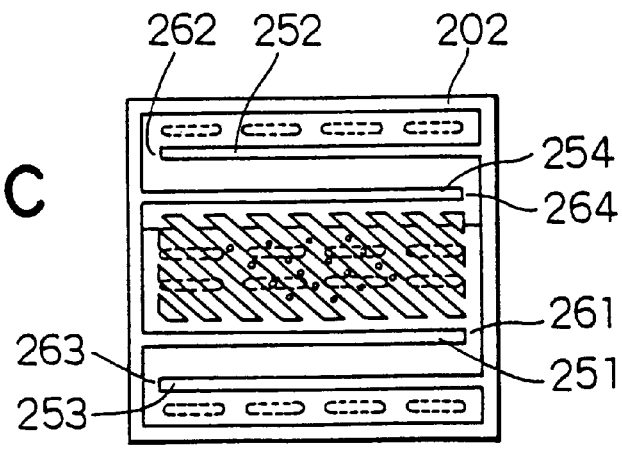

FIGS. 26A to 26C are partial cross sectional views of the cooling apparatus of the tenth embodiment.

The cooling apparatus of this embodiment is different from the cooling apparatus shown in FIG. 17 only in the construction of partition walls. The other portions are the same as those in FIG. 17. Features of the tenth embodiment, which are different from the cooling apparatus shown in FIG. 17, will be mainly described.

As shown in FIGS. 26A to 26C, a first partition wall includes a first member 251 which is a plate member having an opening portion 261 at one end and connected to an inner wall of a refrigerant tank at the other end, and a second member 253 which is a plate member having an opening portion 263 at an end portion thereof on the side where the first member 251 is connected to the tank inner wall, the opposite end of the second member 253 being connected to an inner wall of the refrigerant tank. A second partition wall includes a first member 252 which is a plate member having an opening portion 262 at one end and connected to the inner wall of the refrigerant tank on the side where the opposite end of the second member 253 in the first partition wall is connected, and a second member 254 having an opening portion 264 at an end portion thereof on the side where the first member 252 is connected to the tank inner wall, the opposite end of the second member 254 being connected to the tank inner wall on the side where the opposite end of the first member 251 in the first partition wall is connected.

The first and second members 251 and 253, as first partition walls, and the first and second members 252 and 254, as second partition walls, are positioned so as to be in axial symmetry with respect to the central line of the refrigerant tank 20.

In this way, even if the refrigerant tanks in FIGS. 26A to 26C are reversed upside down (180 degrees), as to one partition walls, one end located above the refrigerant liquid level is connected to an inner wall of the tank, while the opposite end is located below the refrigerant liquid level, and the same operation as that described previously in connection with FIG. 17 is performed. Thus, heat can be radiated efficiently even when the apparatus is rotated upside down (180 degrees), in addition to the effects obtained by the cooling apparatuses shown in FIGS. 17 and 22.

In FIG. 26C, the opening portions 262 and 264 are located above the refrigerant liquid level and the opening portions 261 and 263 located below the liquid level, as shown in FIG. 26C, there basically is performed the same operation as that of the first tube 41 in the cooling apparatus of FIG. 22B; and therefore, a description thereof is here omitted.

Figure 27A:
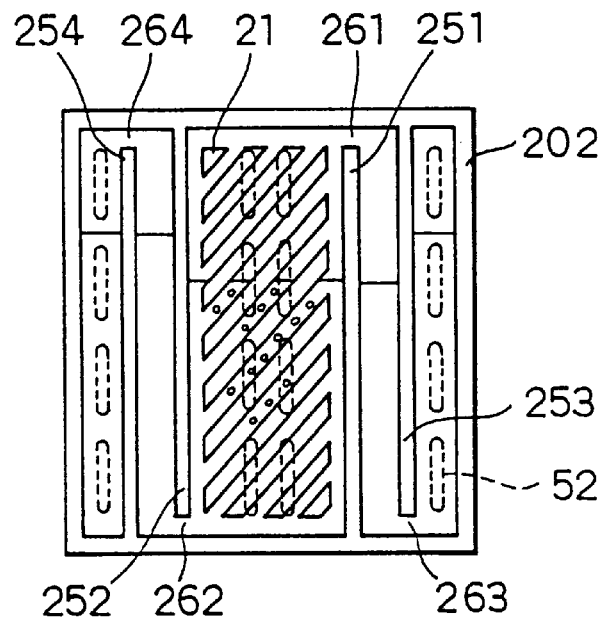
FIGS. 27A and 27B are partial cross sectional views of a refrigerant tank used in an eleventh embodiment of the present invention.
Figure 27B:
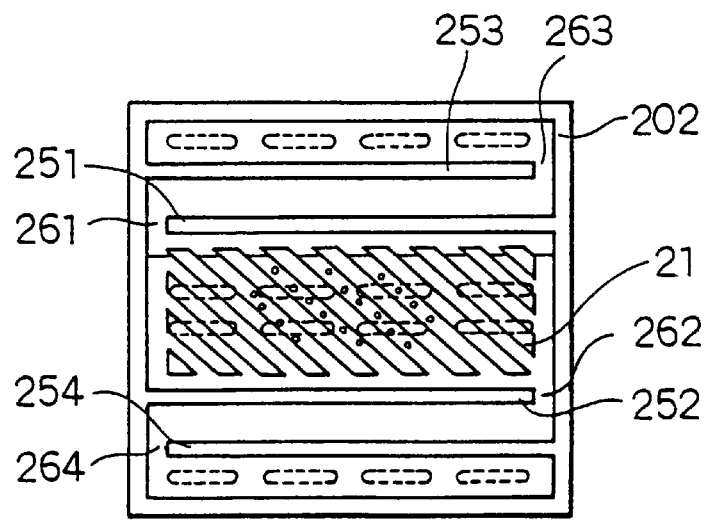
Figure 28A:
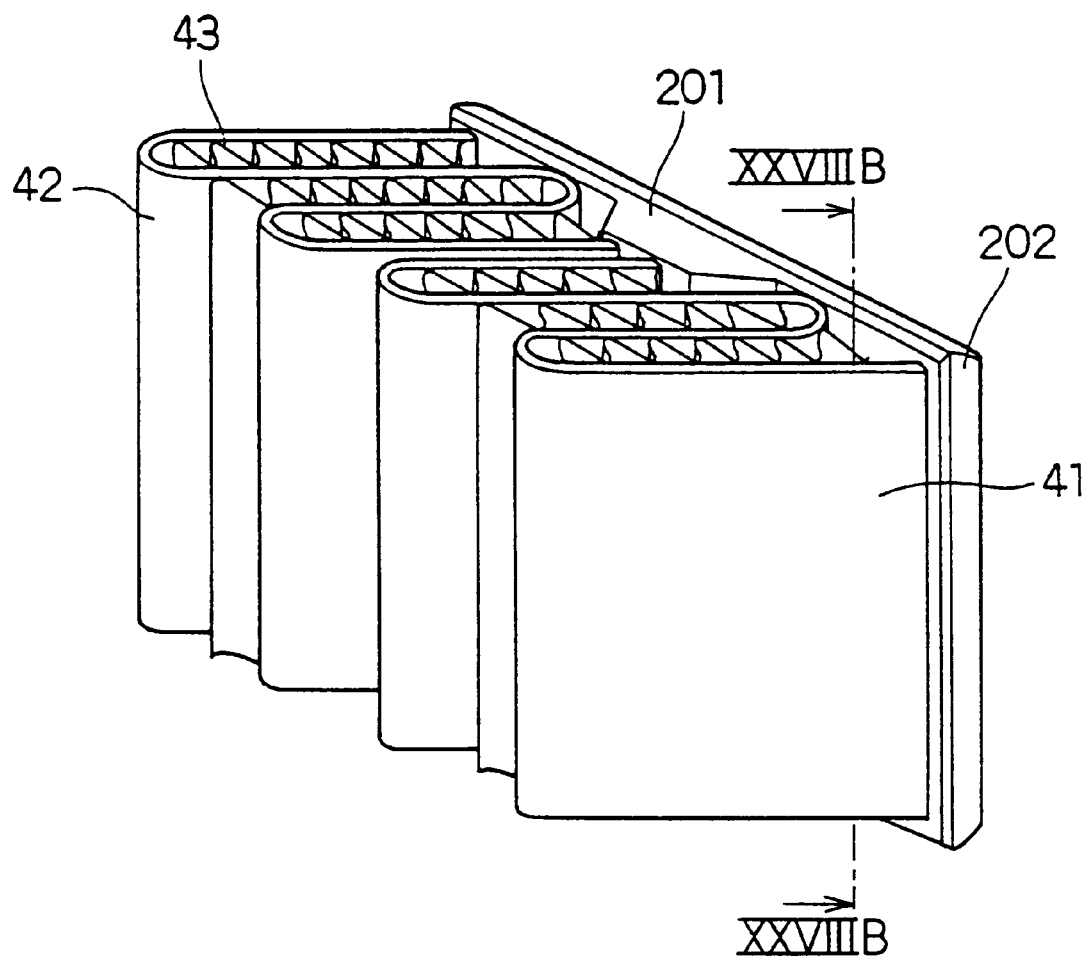
FIG. 28A is a perspective view of a cooling apparatus according to a twelfth embodiment of the present invention.
Figure 28B:
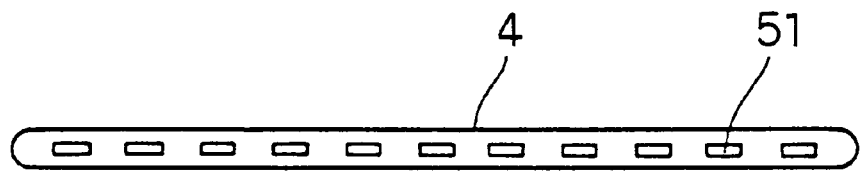
FIG. 28B is a cross sectional view taken along line XXVIIIB—XXVIIIB in FIG. 28A.

It is not always necessary that the opening portions 261 to 264 of the partition walls 251 to 254 in the first tube 41 be positioned in order of up, down, down, and up, as shown in FIG. 26A. The opening portions 261 to 264 may be formed in order of up, down, up, and down, as shown in FIGS. 27A and 27B.

Although in the above seventh to tenth embodiments the first and second tubes are each formed in a plural number (four), these tubes are not limited thereto, but may be constructed by simply forming a plurality of small passages 51 in the interior of the first tube 41 and that of the second tube 42.

In the first to fifth embodiments the first and second radiators are not limited to tubular members. There may be employed a plurality of radiators disclosed in JP-A-57-204156. For example, first and second radiators are connected to the refrigerant tank each through two communication pipes. Of the two communication pipes in the first radiator, one is in communication with the central portion of the refrigerant tank, while the other is in communication with a peripheral edge portion of the refrigerant tank. Further, of the two communication pipes in the second radiator, one is in communication with the central portion of the refrigerant tank, while the other is in communication with a peripheral edge portion of the refrigerant tank. In each of the first to sixth embodiments, it is preferable that the entire apparatus be integrally formed by brazing.

Although the present invention has been fully described in connection with the preferred embodiments thereof with reference to the accompanying drawings, it is to be noted that various changes and modifications will become apparent to those skilled in the art. Such changes and modifications are to be understood as being included within the scope of the present invention as defined in the appended claims.

What is claimed is:

1. A cooling apparatus which boils and condenses refrigerant, for cooling high-temperature medium, said cooling apparatus comprising:

a refrigerant tank having a heat receiving surface for locating said high-temperature medium and receiving heat from said high-temperature medium, said refrigerant tank containing the refrigerant which is boiled and vaporized by absorbing heat from the high-temperature medium, the refrigerant defining a liquid refrigerant level in the refrigerant tank;

a first radiator having a first end in communication with a central portion of said refrigerant tank and a second end in communication with a first peripheral edge portion of said refrigerant tank for radiating heat from said refrierant; and a second radiator having a first end in communication with said central portion of said refrigerant tank adjacent to said first end of said first radiator and a second end in communication with a second peripheral edge portion of said refrigerant tank for radiating heat from said refrigerant, wherein said first end of said first and second radiators are in communication with said refrigerant tank at a position below the liquid refrigerant level in said refrigerant tank, and one of said second ends of the first and second radiators is in communication with said refrigerant tank at a position above the liquid refrigerant level in the refrigerant tank.

2. A cooling apparatus according to claim 1, further comprising:

a connection chamber open to the central portion of said refrigerant tank at a position above the liquid level of the refrigerant, wherein said one ends of said first and second radiators are in communication with said refrigerant tank through said connection chamber.

3. A cooling apparatus according to claim 1, wherein said high-temperature medium is a semiconductor device fixed to the central portion of said refrigerant tank.

4. A cooling apparatus which boils and condenses refrigerant for cooling high-temperature medium, said cooling apparatus comprising:

a refrigerant tank for containing the refrigerant which is boiled and vaporized by receiving heat from the high-temperature medium;

a first radiator having one end in communication with a central portion of said refrigerant tank and another end in communication with one peripheral edge portion of said refrigerant tank; and a second radiator having one end in communication with a central portion of said refrigerant tank adjacent said first radiator and another end in communication with another peripheral edge portion of said refrigerant tank other than said one peripheral edge portion;

wherein said refrigerant tank is provided with an inner fin extending from said one peripheral edge portion side to said another peripheral edge portion side.

5. A cooling apparatus according to claim 4, wherein said inner fin is formed of a plurality of plate members disposed to incline from said one peripheral edge portion side to said another peripheral edge portion side.

6. A cooling apparatus according to claim 1, wherein each of said first and second radiators is formed of a cylindrical member which is bent in a meandering shape.

7. A cooling apparatus according to claim 1, wherein said cylindrical member constituting each of said first and second radiators is a flat tube having plural holes, which is formed by extruding from said one end side to said other end side.

8. A cooling apparatus according to claim 1, wherein said refrigerant tank is a perforated flat tube formed by extrusion from said one peripheral edge portion side to said another peripheral edge portion side.

9. A cooling apparatus which boils and condenses cooling high-temperature medium, said cooling apparatus comprising:
- a refrigerant tank for containing the refrigerant which is boiled and vaporized by receiving heat from the high-temperature medium;
- a first radiator having one end in communication with a central portion of said refrigerant tank and another end in communication with one peripheral edge portion of said refrigerant tank;
- a second radiator having one end in communication with a central portion of said refrigerant tank adjacent said first radiator and another end in communication with another peripheral edge portion of said refrigerant tank other than said one peripheral edge portion;
- a first plate partition member for partitioning between said central portion and said one peripheral edge portion within said refrigerant tank; and
- a second plate partition member for partitioning between said central portion and said another peripheral edge portion within said refrigerant tank.

10. A cooling apparatus according to claim 9, wherein,
said first plate partition member is disposed between said central portion and said one peripheral edge portion within said refrigerant tank and has an opening portion at one end thereof, and
said second plate partition member is disposed between said central portion and said another peripheral edge portion and has an opening portion at an end thereof on the side opposite to said one end.

11. A cooling apparatus according to claim 10, wherein said opening portion of said first plate partition member and said opening portion of said second partition wall are formed diagonally spaced from each other within said refrigerant tank.

12. A cooling apparatus according to claim 9, wherein,
said first plate partition member has an opening portion at one end thereof and is connected at an opposite end thereof to an inner wall of said refrigerant tank, and
said second plate partition member has an opening portion at an end thereof on the side where said first second plate partition member is connected to said inner wall of the refrigerant tank and is connected to an inner wall of said refrigerant tank at an end thereof on the side where said opening of the first plate partition member is formed.

13. A cooling apparatus which boils and condenses refrigerant, for cooling high-temperature medium, said cooling apparatus comprising:
- a refrigerant tank having a heat receiving surface for locating said high-temperature medium and receiving heat from said high-temperature medium, said refrigerant tank for containing the refrigerant which is boiled and vaporized by absorbing heat from the high-temperature medium, said refrigerant tank having a base, the refrigerant defining a liquid refrigerant level in the refrigerant tank;
- a first radiator having a first end in communication with a central portion of said refrigerant tank and a second end in communication with a first peripheral edge portion of said refrigerant tank for radiating heat from said refrigerant; and
- a second radiator having a first end in communication with said central portion of said refrigerant tank adjacent to said first end of said first radiator and a second end in communication with a second peripheral edge portion of said refrigerant tank for radiating heat from said refrigerant,
wherein one of said second end of said first radiator and said second end of said second radiator is positioned at a first height with respect to said base of said refrigerant tank and one of said is end of said first radiator and said first end of said second radiator is positioned at a second height with respect to said base of said refrigerant tank, said first height being different than said second height.

14. A cooling apparatus which boils and condenses refrigerant, for cooling high-temperature medium, said cooling apparatus comprising:
- a refrigerant tank having a heat receiving surface for locating said high-temperature medium and receiving heat from said high-temperature medium, said refrigerant tank for containing the refrigerant which is boiled and vaporized by absorbing heat from the high-temperature medium, the refrigerant defining a liquid refrigerant level in the refrigerant tank;
- a first radiator having a first end in communication with a central portion of said refrigerant tank and a second end in communication with a first peripheral edge portion of said refrigerant tank for radiating heat from said refrigerant; and
- a second radiator having a first end in communication with a central portion of said refrigerant tank adjacently to said first radiator and a second end in communication with another peripheral edge portion of said refrigerant tank for radiating heat from said refrigerant;
wherein one of both said first ends of said first and second radiators and both said second ends of said first and second radiators are opened to said refrigerant tank at a position above the liquid refrigerant level in said refrigerant tank, and
the other one of both said first ends of said first and second radiators and both said second ends of said first and second radiators are opened to said refrigerant tank at a position below the liquid refrigerant level in the refrigerant tank.

15. A cooling apparatus according to claim 14, further comprising:
- a connection chamber open to said central portion of said refrigerant tank at a position above the liquid level of said refrigerant tank;
wherein said one end of said first and second radiators are in communication with said refrigerant tank through said connection chamber.

16. A cooling apparatus according to claim 14, wherein said high-temperature medium is a semiconductor device fixed to said heat receiving surface of said refrigerant tank.

17. A cooling apparatus according to claim 14, wherein each of said first and second radiators is formed of a cylindrical member which is bent in a meandering shape.

18. A cooling apparatus according to claim 14, wherein said cylindrical member constituting each of said first and second radiators is a flat tube having plural holes, which is formed by extruding from said first end to said second end.

19. A cooling apparatus according to claim 14, wherein said refrigerant tank is a perforated flat tube formed by extrusion from said first peripheral edge portion side to said second peripheral edge portion.

* * * * *